US010659016B2

(12) United States Patent
Kashihara

(10) Patent No.: US 10,659,016 B2
(45) Date of Patent: May 19, 2020

(54) SEMICONDUCTOR DEVICE

(71) Applicant: RENESAS ELECTRONICS CORPORATION, Tokyo (JP)

(72) Inventor: Yoji Kashihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/248,307

(22) Filed: Jan. 15, 2019

(65) Prior Publication Data
US 2019/0260362 A1 Aug. 22, 2019

(30) Foreign Application Priority Data
Feb. 20, 2018 (JP) .................................. 2018-027636

(51) Int. Cl.
| | |
|---|---|
| *H03K 3/00* | (2006.01) |
| *H03K 3/356* | (2006.01) |
| *G11C 16/04* | (2006.01) |
| *G11C 8/08* | (2006.01) |
| *G11C 16/08* | (2006.01) |
| *G11C 16/10* | (2006.01) |
| *G11C 16/14* | (2006.01) |

(Continued)

(52) U.S. Cl.
CPC .......... *H03K 3/35613* (2013.01); *G11C 8/08* (2013.01); *G11C 16/0466* (2013.01); *G11C 16/0408* (2013.01); *G11C 16/08* (2013.01); *G11C 16/10* (2013.01); *G11C 16/14* (2013.01); *G11C 16/26* (2013.01); *G11C 16/32* (2013.01)

(58) Field of Classification Search
CPC ....... H03K 19/0013; H03K 19/018521; H03K 19/018528; H03K 19/00315; H03K 19/00361; H03K 3/356113; G11C 8/08; G11C 5/145; G11C 7/12
See application file for complete search history.

(56) References Cited

U.S. PATENT DOCUMENTS

| | | | | |
|---|---|---|---|---|
| 6,099,100 A | * | 8/2000 | Lee ...................... | H03K 17/102 326/81 |
| 2012/0268188 A1 | | 10/2012 | Po et al. | |

(Continued)

FOREIGN PATENT DOCUMENTS

JP          09-172368 A      6/1997

OTHER PUBLICATIONS

Extended European Search Report issued in corresponding European Patent Application No. 19156874.0-1203, dated Jul. 17, 2019.

*Primary Examiner* — Long Nguyen
(74) *Attorney, Agent, or Firm* — McDermott Will & Emery LLP

(57) ABSTRACT

Provided is a level shifter which can retain an operation margin and enhance an exceeded-breakdown-voltage preventing effect. The level shifter in an embodiment includes an exceeded-breakdown-voltage prevention circuit between a pair of first-conductivity-type cross-coupled transistors and a pair of second-conductivity-type input transistors. The exceeded-breakdown-voltage prevention circuit includes first-conductivity-type first transistors and second-conductivity-type second transistors which are coupled in series to each other, and first-conductivity-type third transistors coupled in series to the first and second transistors on a higher-potential side.

18 Claims, 16 Drawing Sheets

(51) Int. Cl.
*G11C 16/26* (2006.01)
*G11C 16/32* (2006.01)

(56) References Cited

U.S. PATENT DOCUMENTS

2017/0047927 A1    2/2017  Liu et al.
2019/0214975 A1*   7/2019  Yang .................. H02M 3/07

* cited by examiner

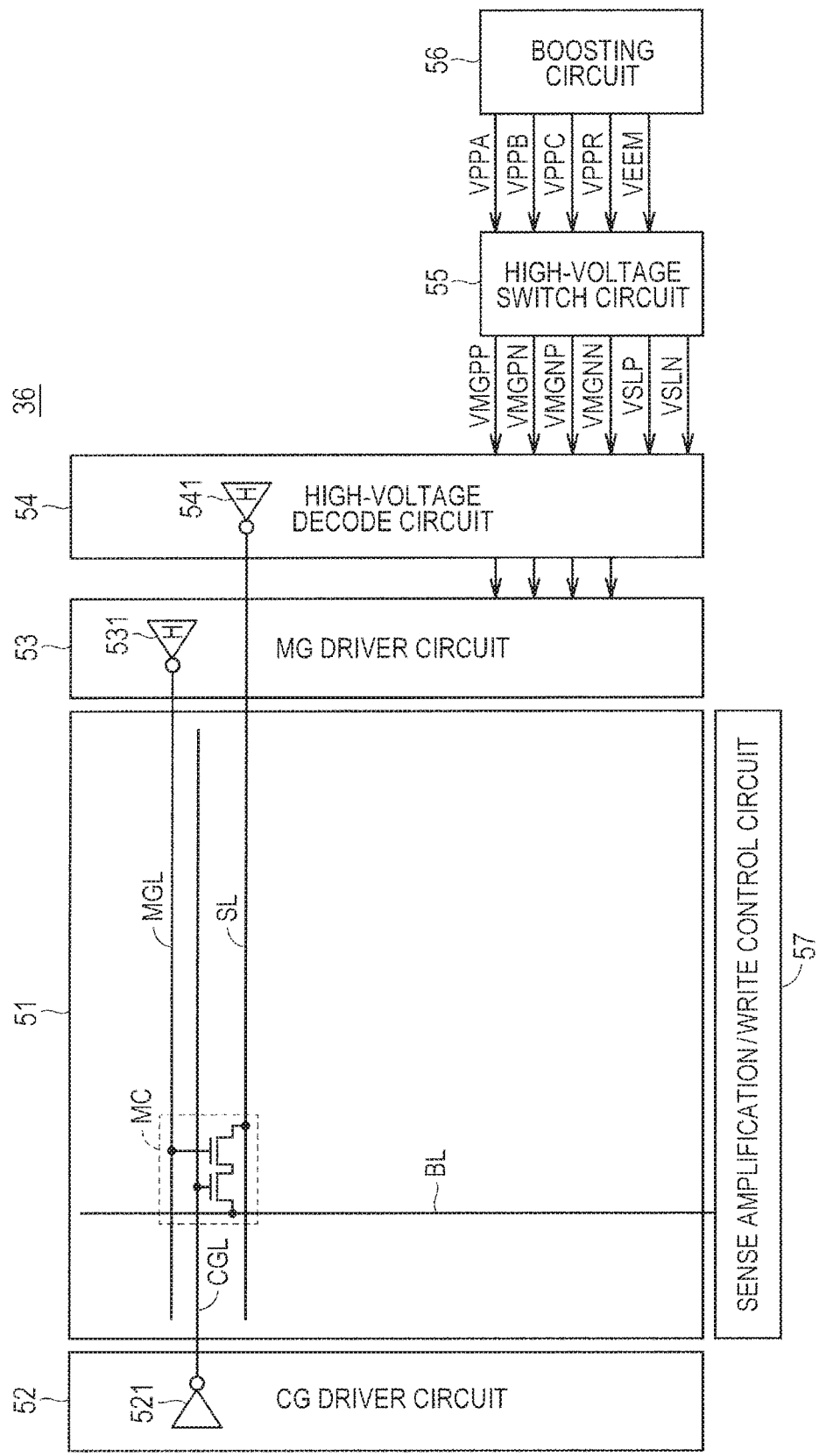

FIG. 3A  SELECTED BLOCK/ SELECTED CELL (WRITE OPERATION) 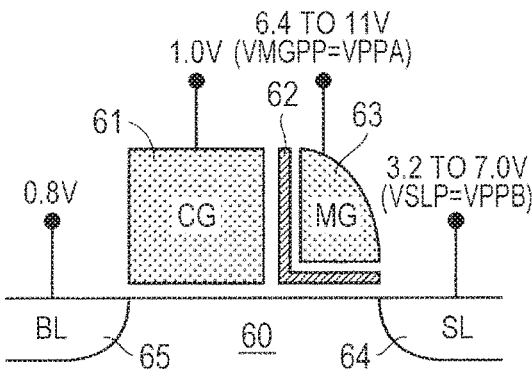
FIG. 3B  SELECTED BLOCK/ NON-SELECTED CELL (NON-WRITE OPERATION) 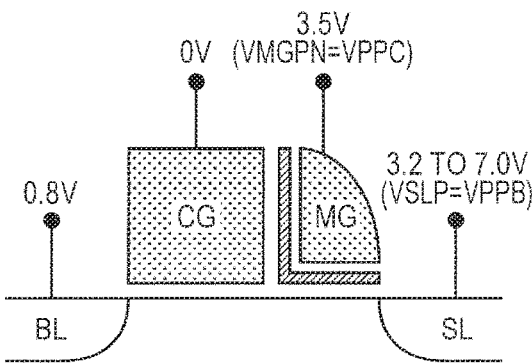
FIG. 3C  NON-SELECTED BLOCK/ SELECTED CELL (NON-WRITE OPERATION) 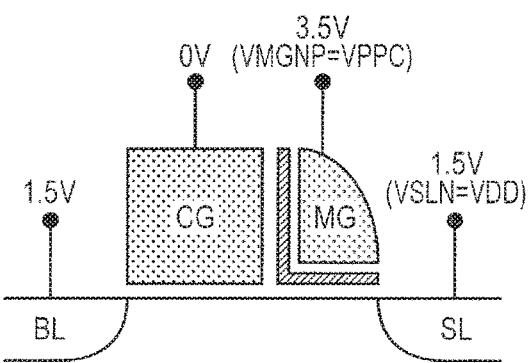
FIG. 3D  NON-SELECTED BLOCK/ NON-SELECTED CELL (NON-WRITE OPERATION) 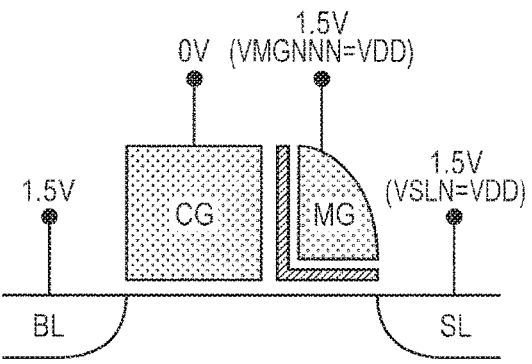

| | | |
|---|---|---|
| FIG. 4A | SELECTED BLOCK/ SELECTED CELL (ERASE OPERATION) | 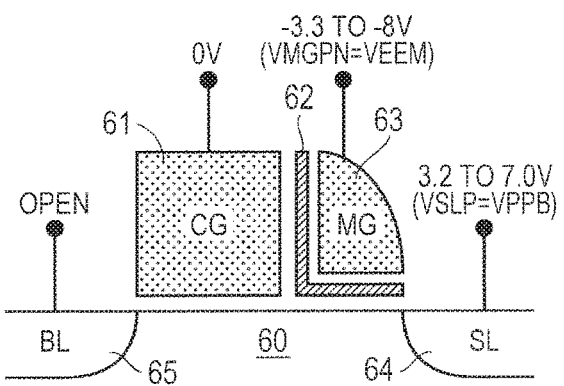 |
| FIG. 4B | SELECTED BLOCK/ NON-SELECTED CELL (NON-ERASE OPERATION) | 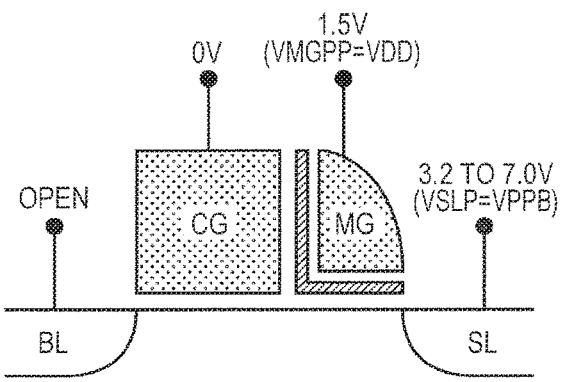 |
| FIG. 4C | NON-SELECTED BLOCK/ SELECTED CELL (NON-ERASE OPERATION) | NO STATE |
| FIG. 4D | NON-SELECTED BLOCK/ NON-SELECTED CELL (NON-ERASE OPERATION) | 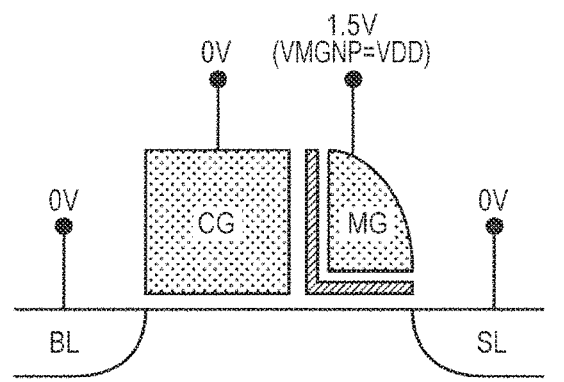 |

US 10,659,016 B2

SEMICONDUCTOR DEVICE

CROSS-REFERENCE TO RELATED APPLICATIONS

The disclosure of Japanese Patent Application No. 2018-027636 filed on Feb. 20, 2018 including the specification, drawings and abstract is incorporated herein by reference in its entirety.

BACKGROUND

The present disclosure relates to a semiconductor device and is used appropriately for, e.g., a semiconductor device including a level shifter.

A technique is known in which, to a cross-coupled level shifter, a clamp MOS transistor for exceeded-breakdown-voltage prevention is added to prevent a voltage of not less than the breakdown voltage from being applied to each of MOS (Metal Oxide Semiconductor) transistors.

For example, the level shifter disclosed in FIG. 1 of Japanese Unexamined Patent Application Publication No. Hei 9(1997)-172368 (Patent Document 1) includes a clamp circuit for exceeded-breakdown-voltage prevention which clamps an intermediate potential, a latch circuit which operates between a high-potential power supply and a clamp potential, and a latch inversion circuit which operates between the clamp potential and a ground potential.

Specifically, the latch circuit includes first and second PMOS (P-channel MOS) transistors having respective sources coupled to the high-potential power supply and respective drains and gates cross-coupled together.

The clamp circuit includes third and fourth PMOS transistors respectively coupled in series to the foregoing first and second PMOS transistors and first and second NMOS (N-channel MOS) transistors respectively coupled in series to the third and fourth PMOS transistors. To the gate of each of these transistors, the clamp potential is applied. The clamp circuit will be hereinafter referred to also as an exceeded-breakdown-voltage prevention circuit.

The latch inversion circuit includes third and fourth NMOS transistors respectively coupled between the first and second NMOS transistors and the ground potential. To the gates of the third and fourth NMOS transistors, complementary input signals are input. The latch inversion circuit will be hereinafter referred to also as an input circuit.

RELATED ART DOCUMENT

Patent Document

[Patent Document 1] Japanese Unexamined Patent Application Publication No. Hei 9(1997)-172368

SUMMARY

When a high voltage is applied to a MOS transistor, as a result of FN (Fowler-Nordheim) degradation or the like, a gate oxide film is damaged. This may cause a situation where the threshold voltage gradually increases and a semiconductor circuit no longer operates. The experience of the present inventors shows that the resistance of a MOS transistor to such a high voltage stress conceivably depends greatly on a manufacturing process.

For example, a logic circuit which has been increasingly miniaturized and operates at a low voltage and a nonvolatile memory circuit which is hard to miniaturize due to a high voltage applied thereto are manufactured in different processes. Accordingly, it is often the case that, in a semiconductor integrated circuit in which a nonvolatile memory circuit is embedded in a logic circuit in mixed relation, the resistance of the nonvolatile memory circuit to a high voltage stress is insufficient.

In the case of the level shifter having the configuration disclosed in Patent Document 1 described above, when the clamp potential supplied to the gate of each of the third and fourth PMOS transistors is increased, the breakdown voltages of the first and second PMOS transistors included in the latch circuit are more reliably prevented from being exceeded. However, increasing the clamp potential of the PMOS transistor included in the exceeded-breakdown-voltage prevention circuit mostly produces the side effect of a reduction in the operation margin of the entire semiconductor circuit, though it depends on the configuration of the semiconductor circuit.

Other problems and novel features of the present invention will become apparent from a statement in the present specification and the accompanying drawings.

A level shifter according to an embodiment includes an exceeded-breakdown-voltage prevention circuit between a pair of first-conductivity-type cross-coupled transistors and a pair of second-conductivity-type input transistors. The exceeded-breakdown-voltage prevention circuit includes a first-conductivity-type first transistor and a second-conductivity-type second transistor which are coupled in series to each other, and a first-conductivity-type third transistor coupled in series to the first and second transistors on a higher-potential side.

The embodiment described above can enhance an exceeded-breakdown-voltage preventing effect on the cross-coupled transistors, while inhibiting a reduction in the operation margin of the entire semiconductor circuit.

BRIEF DESCRIPTION OF THE DRAWINGS

FIG. 2 is a block diagram showing a configuration of a flash memory module (FMDL) in FIG. 1;

FIGS. 3A to 3D are views showing an example of voltages applied to a memory cell during a data write operation in the form of a table;

FIGS. 4A to 4D are views showing an example of voltages applied to a memory cell during a data erase operation in the form of a table;

DETAILED DESCRIPTION

Figure 1:
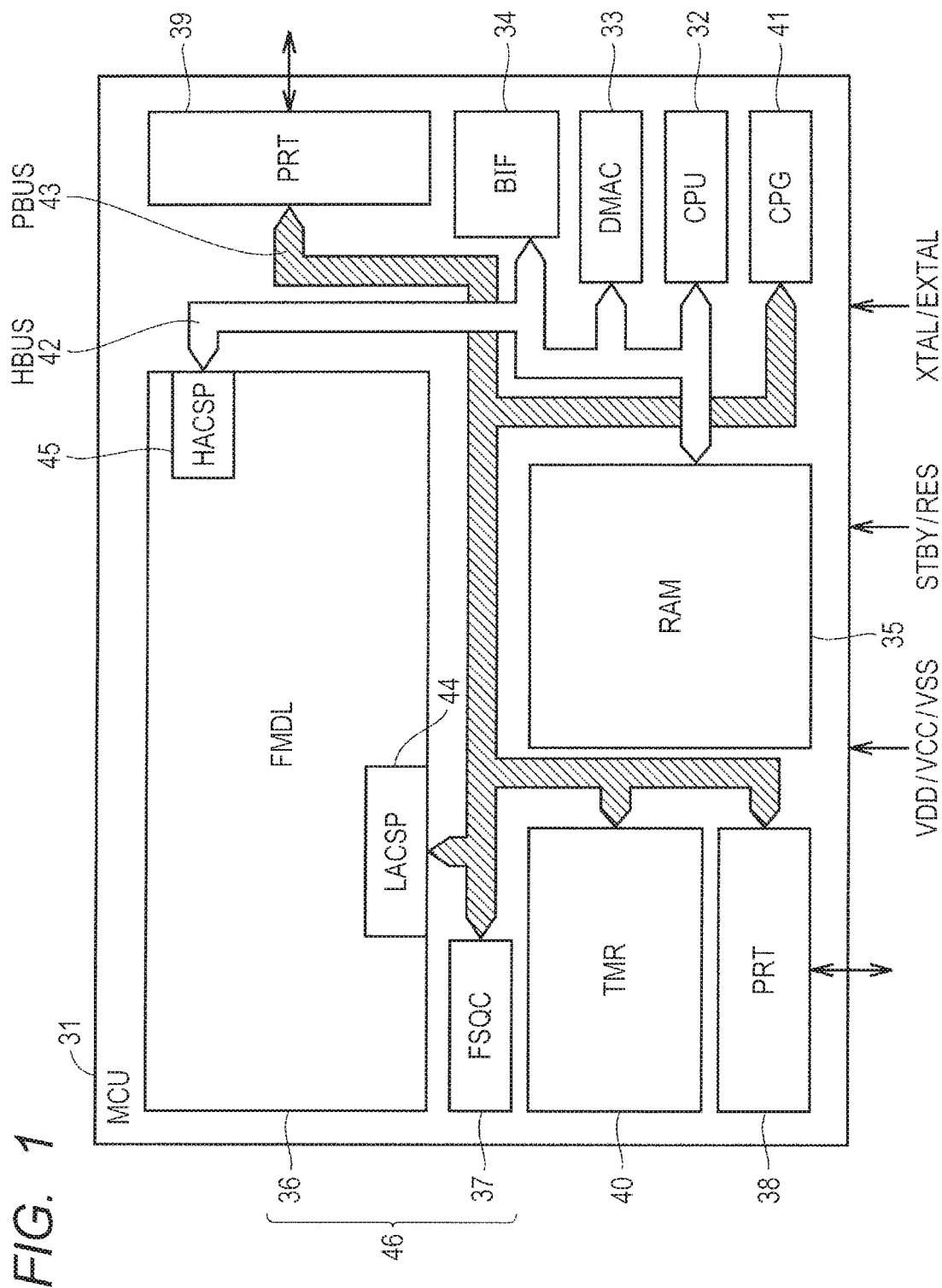
FIG. 1 is a block diagram showing a configuration of a semiconductor device according to a first embodiment.

The following will describe the embodiments of the present invention in detail with reference to the drawings. The following will describe a microcomputer including a flash memory module as an example of a semiconductor device including a level shifter, but the semiconductor device is not limited to the following example. For example, the semiconductor device may also be formed only of a flash memory. The technique disclosed in the present invention is applicable to any semiconductor device including a level shifter.

In the following description, like or equivalent parts are designated by like reference numerals, and the description thereof is not repeated.

<First Embodiment>

[Microcomputer]

FIG. 1 is a block diagram showing a configuration of a semiconductor device according to a first embodiment. FIG. 1 shows a configuration of a microcomputer or a microcontroller unit (MCU) 31 as an example of the semiconductor device.

Referring to FIG. 1, the microcomputer 31 is formed in one semiconductor chip made of monocrystalline silicon or the like using, e.g., a CMOS (Complementary Metal Oxide Semiconductor) integrated circuit manufacturing technique or the like.

As shown in FIG. 1, the microcomputer 31 includes a central processing unit (CPU) 32, a random access memory (RAM) 35, and a flash memory module (FMDL) 36. The central processing unit 32 includes an instruction control unit and an execution unit to execute an instruction. The random access memory 35 is used as a work region for the central processing unit 32 or the like. The flash memory module 36 is provided as a nonvolatile memory module which stores data, a program, and the like.

The microcomputer 31 further includes a direct memory access controller (DMAC) 33, a bus interface circuit (BIF) 34, a flash sequencer (FSQC) 37, external input/output ports (PRT) 38 and 39, a timer (TMR) 40, a clock pulse generator (CPG) 41, a high-speed bus (HBUS) 42, and a peripheral bus (PBUS) 43.

The bus interface circuit 34 performs bus interface control or bus bridge control between the high-speed bus 42 and the peripheral bus 43. The flash sequencer 37 performs command access control on the flash memory module (FMDL) 36. The clock pulse generator 41 generates an internal clock CLK for controlling the microcomputer 31.

A bus configuration in the microcomputer 31 is not particularly limited. In the case of FIG. 1, the high-speed bus (HBUS) 42 and the peripheral bus (PBUS) 43 are provided. Each of the high-speed bus 42 and the peripheral bus 43 includes a data bus, an address bus, and a control bus, though the buses included therein are not particularly limited. By providing the two buses, i.e., the high-speed bus 42 and the peripheral bus 43, it is possible to reduce a load on each of the buses compared to a load on a single common bus when all the circuits are coupled to the single common bus and ensure a high-speed access operation.

To the high-speed bus 42, the central processing unit 32, the direct memory access controller 33, the bus interface circuit 34, the random access memory 35, and the flash memory module 36 are coupled. To the peripheral bus 43, the flash sequencer 37, the external input/output ports 38 and 39, the timer 40, and the clock pulse generator 41 are coupled.

The microcomputer 31 also includes a clock terminal XTAL coupled to an oscillator, a clock terminal EXTAL supplied with an external clock, an external hardware standby terminal STB which gives an instruction to establish a standby state, and an external reset terminal RES which gives an instruction to perform a reset. The microcomputer 31 also includes respective terminals which receive a power supply voltage VDD for a digital circuit, a power supply voltage VCC for an analog circuit, and a ground voltage VSS.

In FIG. 1, the flash sequencer 37 as a logic circuit and the flash memory module 36 configured as an array are shown as different circuit blocks for the sake of convenience, since the flash sequencer 37 and the flash memory module 36 are designed using different CAD tools. However, the flash sequencer 37 and the flash memory module 36 are combined to form a flash memory 46.

The flash memory module 36 is coupled to the high-speed bus (HBUS) 42 via a read-only high-speed access port (HACSP) 45. The central processing unit 32 or the direct memory access controller 33 can make a read access to the flash memory module 36 from the high-speed bus 42 via the high-speed access port 45. When making a write or initialization access to the flash memory module 36, the central processing unit 32 or the direct memory access controller 33 issues a command to the flash sequencer 37 via the bus interface circuit 34 through the peripheral bus (PBUS) 43. In response to the command, the flash sequencer 37 controls initialization of the flash memory module or a write operation thereto from the peripheral bus PBUS through a low-speed access port (LACSP) 44.

[Flash Memory Module]

FIG. 2 is a block diagram showing a configuration of the flash memory module (FMDL) in FIG. 1.

The flash memory module 36 includes a memory cell array 51, a CG driver circuit 52, an MG driver circuit 53, a high-voltage decode circuit 54, a high-voltage switch circuit 55, a boosting circuit 56, and a sense amplification/write control circuit 57.

The memory cell array 51 includes a plurality of memory cells MC arranged in rows and columns. FIG. 2 shows only one of the memory cells MC as a representative. In the present disclosure, as shown in FIGS. 2 to 4, the MONOS (Metal-Oxide-Nitride-Oxide-Silicon) memory cells MC will be described by way of example. However, the technique in the present disclosure is also applicable to the memory cell MC of another structure, such as the floating-gate memory cell MC. A detailed structure of the MONOS memory cell MC will be described using FIGS. 3A to 3D.

The memory cell array 51 also includes a plurality of memory gate lines MGL, a plurality of control gate lines CGL, and a plurality of source lines SL which are provided as control signal lines for the memory cell MC in correspondence to the individual rows of the plurality of memory cells MC as well as a plurality of bit lines BL provided in correspondence to the individual columns of the plurality of memory cells MC. In FIG. 2, the control signal lines coupled to one of the memory cells MC are shown as representatives.

The CG driver circuit 52 includes a plurality of drivers 521 which generate control gate (CG) signals to drive the control gate lines CGL.

The MG driver circuit 53 includes a plurality of drivers 531 which generate memory gate (MG) signals to drive the memory gate lines MGL.

The boosting circuit 56 has an embedded charge pump circuit, generates boosting voltages of different magnitudes, and supplies the generated boosting voltages to the voltage decode circuit 54. Specifically, the boosting circuit 56 generates a write MG positive voltage VPPA, a write non-selected MG positive voltage VPPC, a write SL positive voltage VPPB, an exceeded-breakdown-voltage prevention positive voltage VPPR, and an erase MG negative voltage VEEM.

Hereinbelow, the write MG positive voltage VPPA may be referred to as the high power supply voltage VPPA, the write non-selected MG positive voltage VPPC may be referred to as the intermediate voltage VPPC, and the exceeded-breakdown-voltage prevention positive voltage VPPR may be referred to as the intermediate voltage VPPR. The intermediate voltage VPPC and the intermediate voltage VPPR have values which are between the respective values of the high power supply voltage VPPA and the ground voltage VSS. In the following embodiments, the intermediate voltage VPPR is set to a value between the respective values of the high power supply voltage VPPA and the intermediate voltage VPPC.

The high-voltage switch circuit 55 selects the various boosting voltages generated from the boosting circuit 56 to generate a selected-block higher-potential MG voltage VMGPP, a selected-block lower-potential MG voltage VMGPN, a non-selected-block higher-potential MG voltage VMGNP, a non-selected-block lower-potential MG voltage VMGNN, a selected SL voltage VSLP, and a non-selected SL voltage VSLN. The high-voltage switch circuit 55 supplies the generated voltages as decoder power supply voltages to the high-voltage decode circuit 54.

The high-voltage decode circuit 54 supplies high voltages to the MG driver circuit 53 and the source line SL. More specifically, the high-voltage decode circuit 54 uses the decoder power supply voltage generated from the high-voltage switch circuit 55 to supply a decode signal to the MG driver circuit 53 and generate a source line signal to be supplied to the source line SL.

The sense amplification/write control circuit 57 reads the information stored in the selected memory cell via the bit line BL and writes information to be stored in the selected memory cell through the bit line BL.

[Voltages Supplied to Memory Cell]

Next, a description will be given of an example of the voltages supplied from the CG driver circuit 52, the MG driver circuit 53, the high-voltage decode circuit 54, and the sense amplification/write control circuit 57 each described above to selected/non-selected memory cells in selected/non-selected blocks. The numerical values shown in FIGS. 3A to 3D, FIGS. 4A to 4D, and the like in this specification are given by way of example for illustrative purposes, and the supplied voltages are not limited to these numerical values.

(Example of Voltages Applied to Memory Cell during Data Write Operation)

FIGS. 3A to 3D are views showing an example of voltages applied to a memory cell during a data write operation in the form of a table.

First, referring to FIG. 3A, a brief description will be given of a configuration of the MONOS nonvolatile memory cell MC. The memory cell MC includes a control gate (CG) 61, a silicon nitride film 62, a memory gate (MG) 63, a source 64, and a drain 65. The control gate 61 is formed over the top surface of a P-type silicon substrate 60 via an insulating layer (not shown). The silicon nitride film 62 is formed as an ONO (Oxide-Nitride-Oxide) film including a silicon oxide film (not shown), the silicon nitride film 62, and a silicon oxide film (not shown) over a side wall of the control gate 61. Over the ONO film, the memory gate 63 having a sidewall structure is formed. The source 64 and the drain 65 are formed by implanting an N-type impurity into the regions of the P-type silicon substrate 60 located on both sides of the gates 61 and 63. The source 64 is coupled to the corresponding source line SL, while the drain 65 is coupled to the corresponding bit line BL.

Next, a description will be given of the voltages applied to the memory cell MC during a data write operation. Since the memory gate MG is an electrode to which such a high voltage as to necessitate exceeded-breakdown-voltage prevention is applied, attention will be focused below on the voltages applied to the memory gate MG.

To the selected memory gate MG of the selected memory cell in the selected block shown in FIG. 3A, the voltage VMGPP is applied. During a write operation, as VMGPP, the voltage VPPA is selected. For example, the voltage VPPA has a value of about 6.4 to 11 [V].

To the non-selected memory gate MG of the non-selected memory cell in the selected block shown in FIG. 3B, the voltage VMGPN is applied. During the write operation, as VMGPN, the voltage VPPC is selected. For example, the voltage VPPC has a value of about 3.5 [V].

To the selected memory gate MG of the selected memory cell in the non-selected block shown in FIG. 3C, the voltage VMGNP is applied. During the write operation, as VMGNP, the voltage VPPC is selected. For example, the voltage VPPC has a value of about 3.5 [V].

To the non-selected memory gate MG of the non-selected memory cell in the non-selected block shown in FIG. 3D, the voltage VMGNN is applied. During the write operation, as VMGNN, the voltage VDD is selected. For example, the voltage VDD has a value of about 1.5 [V].

(Example of Voltages Applied to Memory Cell during Data Erase Operation)

FIGS. 4A to 4D are views showing an example of voltages applied to a memory cell during a data erase operation in the form of a table. Since the memory gate MG is an electrode to which such a negative high voltage as to necessitate exceeded-breakdown-voltage prevention is applied, attention will be focused below on the voltages applied to the memory gate MG.

To the selected memory gate MG of the selected memory cell in the selected block shown in FIG. 4A, the voltage VMGPN is applied during an erase operation. During the erase operation, as VMGPN, the voltage VEEM is selected. For example, the voltage VEEM has a value of about −3.3 to −8 [V].

To the non-selected memory gate MG of the non-selected memory cell in the selected block shown in FIG. 4B, the voltage VMGPP is applied. During the erase operation, as VMGPP, the voltage VDD is selected. For example, the voltage VDD has a value of about 1.5 [V].

There is no such state where the non-selected block shown in FIG. 4C has a selected memory during the erase operation. Accordingly, as shown in FIG. 4D, the common voltage VMGNP is applied to all the memory gates MG in the non-selected block during the erase operation. During the erase operation, as VMGNP, the voltage VDD is selected. For example, the voltage VDD has a value of about 1.5 [V].

[High-Voltage Switch Circuit]

FIGS. 5A to 5D are views showing an example of a specific configuration of the high-voltage switch circuit in FIG. 2.

Figure 5A:
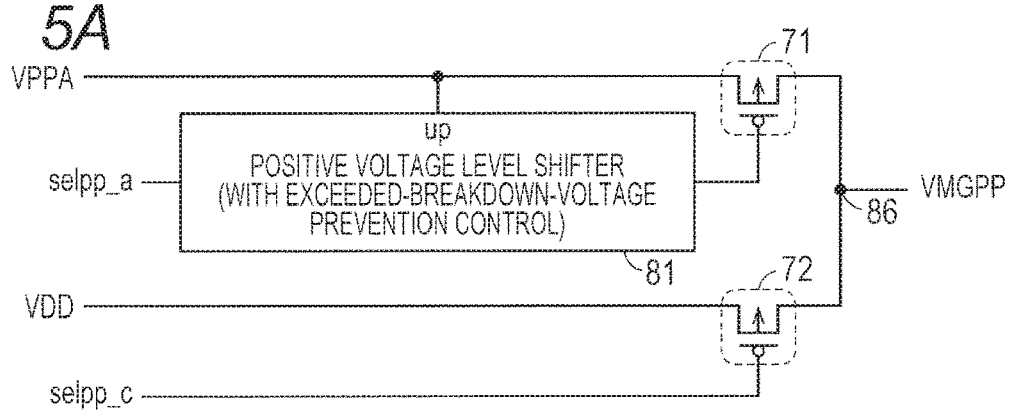
FIGS. 5A to 5D are views showing examples of a specific configuration of a high-voltage switch circuit in FIG. 2.

FIG. 5A shows a circuit which generates the voltage VMGPP. To an output node 86 for the voltage VMGPP, the voltage VPPA is supplied through a switch 71 and the voltage VDD is supplied via a switch 72. Depending on an operation mode, either the voltage VPPA or the voltage VDD is selected.

As each of the switches 71 and 72, one or more PMOS transistors are used. In FIG. 5A, for simpler illustration, each of the switches 71 and 72 is shown as one PMOS transistor. However, when necessary for a breakdown voltage, a plurality of PMOS transistors may also be used or an exceeded-breakdown-voltage prevention MOS transistor may also be inserted. In the same manner as for switches 73 to 78 described later, if necessary for a breakdown voltage, a plurality of MOS transistors may also be used or an exceeded-breakdown-voltage prevention MOS transistor may also be inserted.

The turning ON/OFF of each of the switches 71 and 72 is controlled by VDD level selection signals selpp_a and selpp_c. For the selection signal selpp_c, no level shifter is needed. The VDD level selection signal selpp_c is input directly to the gate of the PMOS transistor included in the switch 72.

On the other hand, the VDD level selection signal selpp_a is converted by a positive voltage level shifter 81 to a VPPA level signal. The VPPA level selection signal selpp_a is input to the gate of the PMOS transistor included in the switch 71. The voltage VPPA is input to a terminal up of the positive voltage level shifter 81. Since the voltage VPPA is a high voltage, the positive voltage level shifter 81 needs exceeded-breakdown-voltage prevention.

Figure 5B:
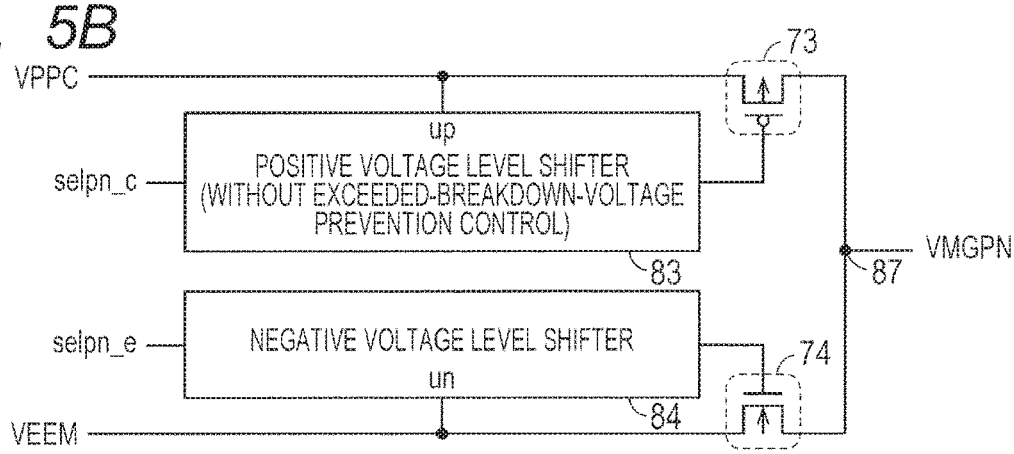

FIG. 5B shows a circuit which generates the voltage VMGPN. To an output node 87 for the voltage VMGPN, the voltage VPPC is supplied through the switch 73 and the voltage VEEM is supplied via the switch 74. Depending on the operation mode, either the voltage VPPC or the voltage VEEM is selected. As the switch 73, one or more PMOS transistors are used while, as the switch 74, one or more NMOS transistors are used.

The turning ON/OFF of the switch 73 is controlled by a VDD level selection signal selpn_c. The VDD level selection signal selpn_c is converted by a positive voltage level shifter 83 to a VPPC level signal. The VPPC level selection signal selpn_c is input to the gate of the PMOS transistor included in the switch 73. To the terminal up of the positive voltage level shifter 83, the voltage VPPC is input. Since the voltage VPPC is not a high voltage, the positive voltage level shifter 83 needs no exceeded-breakdown-voltage prevention.

The turning ON/OFF of the switch 74 is controlled by a VDD level selection signal selpn_e. The VDD level selection signal selpn_e is converted by a negative voltage level shifter 84 to a VEEM level signal. The VEEM level selection signal selpn_e is input to the gate of the NMOS transistor included in the switch 74. To a terminal un of the negative voltage level shifter 84, the voltage VEEM is input.

Figure 5C:
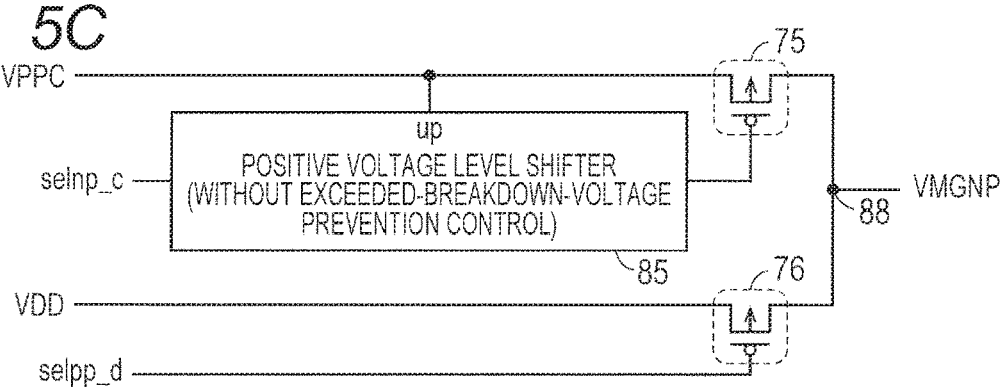

FIG. 5C shows a circuit which generates the voltage VMGNP. To an output node 88 for the voltage VMGNP, the voltage VPPC is supplied through the switch 75 and the voltage VDD is supplied through the switch 76. Depending on the operation mode, either the voltage VPPC or the voltage VDD is selected. As each of the switches 75 and 76, one or more PMOS transistors are used.

The turning ON/OFF of the switches 75 and 76 is controlled by VDD level selection signals selnp_c and selpp_d. For the selection signal selpp_d, no level shifter is needed. The VDD level selection signal selpp_d is input directly to the gate of the PMOS transistor included in the switch 76.

On the other hand, the VDD level selection signal selnp_c is converted by a positive voltage level shifter 85 to a VPPC level signal. The VPPC level selection signal selnp_c is input to the gate of the PMOS transistor included in the switch 75. To the terminal up of the positive voltage level shifter 85, the voltage VPPC is input. Since the voltage VPPC is not a high voltage, the positive voltage level shifter 85 needs no exceeded-breakdown-voltage prevention.

Figure 5D:
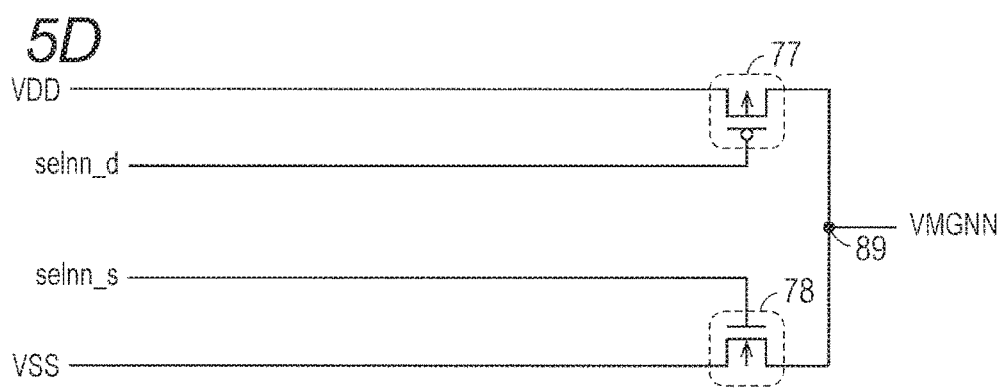

FIG. 5D shows a circuit which generates the voltage VMGNN. To an output node 89 for the voltage VMGNN, the voltage VDD is supplied through the switch 77 and the voltage VSS is supplied through the switch 78. Depending on the operation mode, either the voltage VDD or the voltage VSS is selected. As the switch 77, one or more PMOS transistors are used. As the switch 78, one or more NMOS transistors are used.

The turning ON/OFF of the switches 77 and 78 is controlled by VDD level selection signals selnn_d and selnn_s. For either the selection signal selnn_d or selnn_s, no level shifter is needed. The selection signal selnn_s is input directly to the gate of the PMOS transistor included in the switch 77. The selection signal selnn_s is input directly to the gate of the NMOS transistor included in the switch 78.

Table 1 is a collection of examples of the boosting voltages selected by the high-voltage switch circuit in FIG. 2.

TABLE 1

Examples of Boosting Voltages Selected by High-Voltage Switch Circuit

|  | Written State | Erased State |
| --- | --- | --- |
| VMGPP | VPPA | VDD |
| VMGPN | VPPC | VEEM |
| VMGNP | VPPC | VDD |
| VMGNN | VDD | VSS |

As shown in Table 1, the high-voltage switch circuit 55 selects VPPA as the output voltage VMGPP in a written state and selects VDD as the output voltage VMGPP in an erased state. The high-voltage switch circuit 55 selects VPPC as the output voltage VMGPN in the written state and selects VEEM as the output voltage VMGPN in the erased state. The high-voltage switch circuit 55 selects VPPC as the output voltage VMGNP in the written state and selects VDD as the output voltage VMGNP in the erased state. The high-voltage switch circuit 55 selects VDD as the output voltage VMGNN in the written state and selects VSS as the output voltage VMGNN in the erased state.

Note that, to correspond to a verify mode, a test mode, and the like each as an operation mode in a state other than the written state and the erase state, an additional switch may be provided in the high-voltage switch circuit 55.

As shown in FIG. 5, to form the high-voltage switch circuit 55 in FIG. 2, the level shifters 81 and 83 to 85 are needed. Among them, for the positive voltage level shifter 81, it is necessary to consider exceeded-breakdown-voltage prevention. This is because, as the voltage VPPA applied to the memory gate MG during a write operation, a high voltage of the order of, e.g., 11 V is used but, even though the MOS transistor included in the positive voltage level shifter 81 is of a high-breakdown-voltage type, the breakdown voltage thereof is about 10 V at the highest. Accordingly, it is necessary to perform exceeded-breakdown-voltage prevention control and prevent the high power supply voltage VPPA from being applied directly to each of the MOS transistors included in the positive voltage level shifter 81.

[Example of Configuration of Level Shifter]

Figure 6:
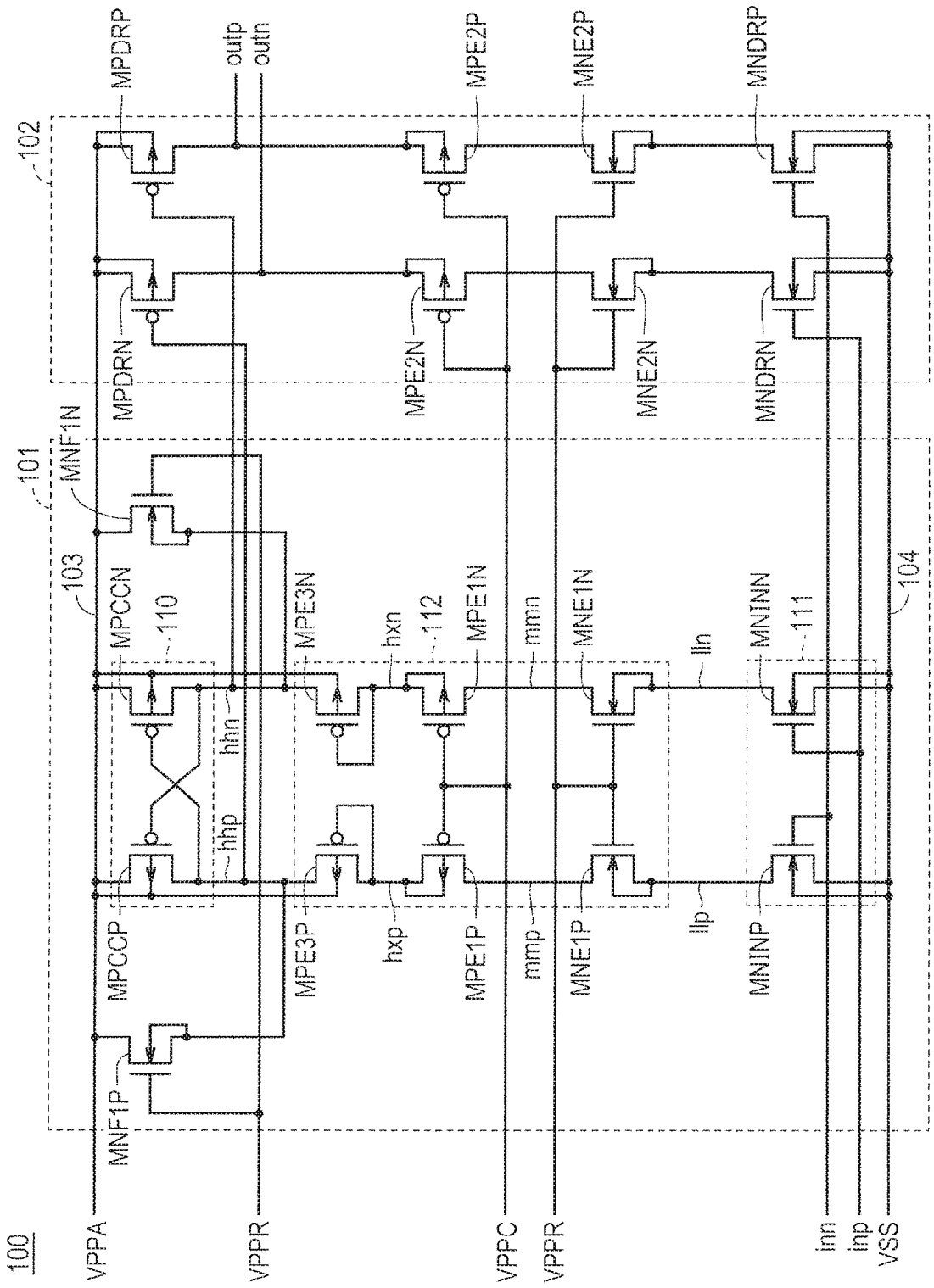
FIG. 6 is a circuit diagram showing a configuration of a level shifter used in the semiconductor device in the first embodiment.

FIG. 6 is a circuit diagram showing a configuration of the level shifter used in the semiconductor device in the first embodiment. A level shifter 100 in FIG. 6 is applicable to the positive voltage level shifter 81 in FIG. 5A.

Referring to FIG. 6, the level shifter 100 includes a high-voltage node 103 to which the high power supply voltage VPPA is input, a ground node 104 to which the ground voltage VSS is input, a level shifter stage 101 which converts VDD level complementary input signals inp and inn to VPPA level signals, and a driver stage 102 provided subsequent to the level shifter stage 101. In the present disclosure, the ground voltage VSS is referred to also as a reference voltage, the high-voltage node 103 is referred to also as a first power supply node, and the ground node 104 is referred to also as a second power supply node. For example, the high-voltage power supply voltage VPPA is about 6.4 to 11 [V] and generated by the charge pump circuit embedded in the boosting circuit 56 to vary in accordance with a control signal output from the flash sequencer 37.

The level shifter stage 101 includes a latch circuit 110, an input circuit 111 to which the complementary input signals inp and inn are input, an exceeded-breakdown-voltage prevention circuit 112 coupled between the latch circuit 110 and the input circuit 111, and clamp NMOS transistors MNF1P and MNF1N.

The latch circuit 110 includes a pair of cross-coupled PMOS transistors MPCCP and MPCCN having respective sources coupled to the high-voltage node 103. The PMOS transistors MPCCP and MPCCN have respective gates and drains cross-coupled together. Specifically, the gate of the PMOS transistor MPCCP and the drain of the PMOS transistor MPCCN are coupled together, while the drain of the PMOS transistor MPCCP and the gate of the PMOS transistor MPCCN are coupled together.

The input circuit 111 includes a pair of input NMOS transistors MNINP and MNINN. Each of the sources of the input NMOS transistors MNINP and MNINN is coupled to the ground node 104. To the gate of the input NMOS transistor MNINP, the input signal inn is input while, to the gate of the input NMOS transistor MNINN, the input signal inp is input.

The exceeded-breakdown-voltage prevention circuit 112 includes exceeded-breakdown-voltage prevention NMOS transistors MNE1P and MNE1N, exceeded-breakdown-voltage prevention PMOS transistors MPE1P and MPE1N, and additional exceeded-breakdown-voltage prevention transistors MPE3P and MPE3N. Compared to the exceeded-breakdown-voltage prevention circuit in Patent Document 1 described above, the exceeded-breakdown-voltage prevention circuit 112 is different therefrom in that the additional exceeded-breakdown-voltage prevention PMOS transistors MPE3P and MPE3N are provided.

More specifically, the exceeded-breakdown-voltage prevention MOS transistors MPE3P, MPE1P, and MNE1P are arranged in this order and coupled in series between the drain of the PMOS transistor MPCCP and the drain of the input NMOS transistor MNINP. Likewise, the exceeded-breakdown-voltage prevention MOS transistors MPE3N, MPE1N, and MNE1N are arranged in this order and coupled in series between the drain of the PMOS transistor MPCCN and the drain of the input NMOS transistor MNINN. Consequently, in the exceeded-breakdown-voltage prevention circuit 112, the exceeded-breakdown-voltage prevention PMOS transistors MPE3P and MPE3N are provided on a highest potential side, while the exceeded-breakdown-voltage prevention NMOS transistors MNE1P and MNE1N are provided on a lowest potential side. The exceeded-breakdown-voltage prevention PMOS transistors MPE1P and MPE1N are coupled respectively between the exceeded-breakdown-voltage prevention PMOS transistors MPE3P and MPE3N and the exceeded-breakdown-voltage prevention NMOS transistors MNE1P and MNE1N.

In the following description, respective coupling nodes between the cross-coupled PMOS transistors MPCCP and MPCCN and the exceeded-breakdown-voltage prevention PMOS transistors MPE3P and MPE3N are referred to as intermediate nodes hhp and hhn. Respective coupling nodes between the exceeded-breakdown-voltage prevention PMOS transistors MPE3P and MPE3N and the exceeded-breakdown-voltage prevention PMOS transistors MPE1P and MPE1N are referred to as intermediate nodes hxp and hxn. Respective coupling nodes between the exceeded-breakdown-voltage prevention PMOS transistors MPE1P and MPE1N and the exceeded-breakdown-voltage prevention NMOS transistors MNE1P and MNE1N are referred to as intermediate nodes mmp and mmn. Respective coupling nodes between the exceeded-breakdown-voltage prevention NMOS transistors MNE1P and MNE1N and the input NMOS transistors MNINP and MNINN are referred to as intermediate nodes 11$p$ and 11$n$.

To each of the gates of the exceeded-breakdown-voltage prevention PMOS transistors MPE1P and MPE1N, the intermediate voltage VPPC is input. To each of the gates of the exceeded-breakdown-voltage prevention NMOS transistors MNE1P and MNE1N, the intermediate voltage VPPR is applied. The intermediate voltages VPPR and VPPC have values between those of the ground voltage VSS and the high power supply voltage VPPA. For example, the intermediate voltage VPPR is 5.5 V, the intermediate voltage VPPC is 3.0 V, and the intermediate voltage VPPR is set to a value between those of the high power supply voltage VPPA and the intermediate voltage VPPC.

The exceeded-breakdown-voltage prevention PMOS transistors MPE3P and MPE3N have respective gates and drains coupled together. In other words, each of the exceeded-breakdown-voltage prevention PMOS transistors MPE3P and MPE3N is a diode-coupled transistor.

The clamp NMOS transistor MNF1P is coupled between the source (i.e., intermediate node hhp) of the exceeded-breakdown-voltage prevention PMOS transistor MPE3P and the high-voltage node 103. Likewise, the clamp NMOS transistor MNF1N is coupled between the source (i.e., intermediate node hhn) of the exceeded-breakdown-voltage prevention PMOS transistor MPE3N and the high-voltage node 103. To each of the gates of the clamp NMOS transistors MNF1P and MNF1N, e.g., the intermediate voltage VPPR is applied. The clamp NMOS transistors MNF1P and MNF1N are intended to clamp the voltages at the intermediate nodes hhp and hhn when the corresponding PMOS transistors MPCCP and MPCCN are OFF.

The driver stage 102 includes driver PMOS transistors MPDRP and MPDRN, driver NMOS transistors MNDRP and MNDRN, exceeded-breakdown-voltage prevention PMOS transistors MPE2P and MPE2N, and exceeded-breakdown-voltage prevention NMOS transistors MNE2P and MNE2N.

The driver PMOS transistors MPDRP and MPDRN have respective sources coupled to the high-voltage node 103 and respective gates coupled to the intermediate nodes hhn and hhp. From the respective drains of the driver PMOS transistors MPDRP and MPDRN, complementary output signals outp and outn are output.

The driver NMOS transistors MNDRP and MNDRN have respective sources coupled to the ground node 104. To the gate of the driver NMOS transistor MNDRP, the input signal inn is input while, to the gate of the driver NMOS transistor MNDRN, the input signal inp is input.

The exceeded-breakdown-voltage prevention PMOS transistor MPE2P and the exceeded-breakdown-voltage prevention NMOS transistor MNE2P are arranged in this order and coupled in series between the drain of the driver PMOS transistor MPDRP and the drain of the driver NMOS transistor MNDRP. Likewise, the exceeded-breakdown-voltage prevention PMOS transistor MPE2N and the exceeded-breakdown-voltage prevention NMOS transistor MNE2N are arranged in this order and coupled in series between the drain of the driver PMOS transistor MPDRN and the drain of the driver NMOS transistor MNDRN.

To each of the gates of the exceeded-breakdown-voltage prevention PMOS transistors MPE2P and MPE2N, the intermediate voltage VPPC (e.g., 3.0 V) is applied. To each of the gates of the exceeded-breakdown-voltage prevention NMOS transistors MNE2P and MNE2N, the intermediate voltage VPPR (e.g., 5.5 V) is applied.

The back gate (i.e., substrate) of each of the MOS transistors described above except for the exceeded-breakdown-voltage prevention PMOS transistors MPE3P and MPE3N are coupled to the source of the transistor. Each of the back gates of the exceeded-breakdown-voltage prevention PMOS transistors MPE3P and MPE3N is coupled to the high-voltage node 103 to receive the high power supply voltage VPPA.

[Operation of Level Shifter]

Next, a description will be given of the operation of the level shifter 100 in FIG. 6 particularly from the viewpoint of exceeded-breakdown-voltage prevention. Note that the following numerical values are exemplary for illustrative purposes and not restrictive.

(Outline of Overall Operation of Level Shifter)

Referring to FIG. 6, in response to the VDD level complementary input signals inp and inn, one of the input NMOS transistors MNINP and MNINN is brought into an ON state, while the other thereof is brought into an OFF state.

For example, it is assumed that the voltage of the input signal inp is VDD (e.g., 1.5 V) and the voltage of the input signal inn is VSS (e.g., 0 V). In this case, the input NMOS transistor NMINN of the input circuit 111 is brought into the ON state, while the input NMOS transistor MNINP of the input circuit 111 is brought into the OFF state. In addition, the driver NMOS transistor MNDRN in the driver stage 102 is brought into the ON state, while the driver NMOS transistor MNDRP in the driver stage 102 is brought into the OFF state.

When the input NMOS transistor MNINN is brought into the ON state, each of the intermediate nodes 11n and mmn has the voltage VSS (0 V). As a result, the gate voltage of the PMOS transistor MPCCP included in the latch circuit 110 shifts to a LOW level to bring the PMOS transistor MPCCP into the ON state and shift the voltage at the intermediate node hhp to a HIGH level, i.e., the high power supply voltage VPPA (e.g., 11 V). On the other hand, the PMOS transistor MPCCN is brought into the OFF state to shift the voltage at the intermediate node hhn to the LOW level.

In addition, the voltage at the intermediate node hhp shifts to the HIGH level (VPPA) and the voltage at the intermediate node hhn shifts to the LOW level to bring the driver PMOS transistor MPDRP included in the driver stage 102 into the ON state and bring the driver PMOS transistor MPDRN included in the driver stage 102 into the OFF state. Finally, the output signal outp shifts to the HIGH level (VPPA), while the output signal outn shifts to the LOW level.

Conversely to the above, it is assumed that the voltage of the input signal inp is VSS (e.g., 0 V) and the voltage of the input signal inn is VDD (e.g., 1.5 V). In this case, the PMOS transistor MPCCP included in the latch circuit 110 is brought into the OFF state to shift the voltage at the intermediate node hhp to the LOW level, while the PMOS transistor MPCCN is brought into the ON state to shift the voltage at the intermediate node hhn to the HIGH level (VPPA). As a result, the driver PMOS transistor MPDRP included in the driver stage 102 is brought into the OFF state, while the driver PMOS transistor MPDRN included in the driver stage 102 is brought into the ON state. Finally, the output signal outp shifts to the LOW level, while the output signal outn shifts to the HIGH level (VPPA).

(Function of Exceeded-Breakdown-Voltage Prevention Circuit)

Next, a description will be given of the function of the exceeded-breakdown-voltage prevention circuit 112. First, to each of the gates of the exceeded-breakdown-voltage prevention NMOS transistors MNE1P, MNE1N, MNE2P, and MNE2N, the intermediate voltage VPPR (e.g., 5.5 V) is applied. This limits each of the drain voltages of the input NMOS transistors MNINP and MNINN and each of the drain-source voltages of the driver NMOS transistors MNDRP and MNDRN to the intermediate voltage VPPR (5.5 V). Thus, the respective breakdown voltages of the NMOS transistors MNINP, MNINN, MNDRP, and MNDRN are successfully prevented from being exceeded.

To each of the gates of the exceeded-breakdown-voltage prevention PMOS transistors MPE1P, MPE1N, MPE2P, and MPE2N, the intermediate voltage VPPC (e.g., 3.0 V) is applied. This limits the voltage applied between the source and the drain of each of the PMOS transistors MPCCP and MPCCN included in the latch circuit 110 and the driver PMOS transistors MPDRP and MPDRN to VPPA−VPPC (e.g., 11 V−3 V=8 V).

By further causing a current of an appropriate magnitude to flow to the exceeded-breakdown-voltage prevention PMOS transistor MPE3P through the clamp NMOS transistor MNF1P, a potential difference of not less than a threshold voltage Vth (about 1 V) can be produced between the source and the drain of the exceeded-breakdown-voltage prevention PMOS transistor MPE3P (i.e., between the intermediate node hhp and the intermediate node hxp). Likewise, by causing a current of an appropriate magnitude to flow to the exceeded-breakdown-voltage prevention PMOS transistor MPE3N through the clamp NMOS transistor MNF1N, a potential difference of not less than the threshold voltage Vth (about 1 V) can be produced between the source and the drain of the exceeded-breakdown-voltage prevention PMOS transistor MPE3P (i.e., between the intermediate node hhp and the intermediate node hxp). Thus, it is possible to further enhance an exceeded-breakdown-voltage preventing effect on each of the PMOS transistors MPCCP and MPCCN included in the latch circuit 110 and the driver PMOS transistors MPDRP and MPDRN.

Irrespective of the ON/OFF state of each of the PMOS transistors MPCCP and MPCCN included in the latch circuit 110, it is important to constantly supply currents to the exceeded-breakdown-voltage prevention PMOS transistors MPE3P and MPE3N. Unless there are current supplies to the exceeded-breakdown-voltage prevention PMOS transistors MPE3P and MPE3N, when there are leakage currents in the exceeded-breakdown-voltage prevention PMOS transistors MPE3P and MPE3N, the potentials at the intermediate nodes hhp and hhn can no longer be retained (i.e., the potentials at the intermediate nodes hhp and hhn drop to the potentials at the intermediate nodes hxp and hxn). As a result, a sufficient exceeded-breakdown-voltage preventing effect cannot be obtained on each of the PMOS transistors MPCCP and MPCCN included in the latch circuit 110 and the driver PMOS transistors MPDRP and MPDRN.

To prevent the situation described above, the clamp NMOS transistors MNF1P and MNF1N are provided. When the intermediate voltage VPPR (e.g., 5.5 V) is applied to each of the gates of the clamp NMOS transistors MNF1P and MNF1N to reduce the voltages at the intermediate nodes hhp and hhn to VPPR−Vthn, currents are supplied thereto from the exceeded-breakdown-voltage prevention PMOS transistors MPE3P and MPE3N. The voltage Vthn mentioned herein is the threshold voltage of each of the clamp NMOS transistors MNF1P and MNF1N, which is about 1 V. As a result, the voltages at the intermediate nodes hhp and hhn are clamped to a value around 5.5−1=4.5 [V].

Actually, the voltages at the intermediate nodes hhp and hhn depend on the size ratios between the clamp NMOS transistors MNF1P and MNF1N and the exceeded-breakdown-voltage prevention PMOS transistors MPE3P and MPE3N. Specifically, when the sizes (i.e., gate widths) of the clamp NMOS transistors MNF1P and MNF1N are reduced, the currents supplied to the exceeded-breakdown-voltage prevention PMOS transistors MPE3P and MPE3N are reduced so that the respective source-drain voltages of the exceeded-breakdown-voltage prevention PMOS transistors MPE3P and MPE3N approach Vthp. As a result, the lower limit value of the voltages at the intermediate nodes hhp and hhn approaches 4 V. Conversely, when the sizes of the clamp NMOS transistors MNF1P and MNF1N are increased, the currents supplied to the exceeded-breakdown-voltage prevention PMOS transistors MPE3P and MPE3N are increased to increase the respective source-drain voltages of the exceeded-breakdown-voltage prevention PMOS transistors MPE3P and MPE3N. As a result, the voltages at the intermediate nodes hhp and hhn approach 4.5 V as the maximum voltage determined by the respective gate voltages of the clamp NMOS transistors MNF1P and MNF1N.

As a result of the foregoing, the lower limit voltage at the intermediate nodes hxp and hxn is the intermediate voltage VPPC (3.0 V), while the lower limit voltage at the intermediate nodes hhp and hhn is 4 to 4.5 V. Accordingly, the additional exceeded-breakdown-voltage preventing effect achieved by the exceeded-breakdown-voltage prevention PMOS transistors MPE3P and MPE3N is 1 to 1.5 V.

[Effects of First Embodiment]

As described above, according to the first embodiment, in the current path coupling together the latch circuit 110 and the input circuit 111 each included in the level shifter 100, not only the exceeded-breakdown-voltage prevention PMOS transistors MPE1P and MPE1N and the exceeded-breakdown-voltage prevention NMOS transistors MNE1P and MNE1N, but also the exceeded-breakdown-voltage prevention PMOS transistors MPE3P and MPE3N are provided. This can reduce the maximum voltage applied between the gate and the source of each of the cross-coupled PMOS transistors MPCCP and MPCCN and the driver PMOS transistors MPDRP and MPDRN that require exceeded-breakdown-voltage prevention.

A description will be given using an example of specific numerical values. When the exceeded-breakdown-voltage prevention PMOS transistors MPE3P and MPE3N are not provided, the maximum potential difference between the high-voltage node 103 and each of the intermediate nodes hhp and hhn is VPPA (11 V)−VPPC (3 V)=8 V. On the other hand, by providing the exceeded-breakdown-voltage prevention PMOS transistors MPE3P and MPE3N, the maximum potential difference between the high-voltage node 103 and each of the intermediate nodes hhp and hhn drops to VPPA (11 V)−VPPC (3 V)−(1 to 1.5 V)=6.5 to 7 V. Thus, the maximum voltage applied between the gate and the source of each of the cross-coupled PMOS transistors MPCCP and MPCCN and the driver PMOS transistors MPDRP and MPDRN can be reduced from 8 V to 6.5 to 7 V.

When a high source-gate voltage is applied to a MOS transistor in the ON state for a long period of time, due to FN degradation, the threshold voltage Vth of the MOS transistor deteriorates (i.e., increases). Specifically, when the threshold voltage Vth of each of the cross-coupled PMOS transistors MPCCP and MPCCN included in the latch circuit 110 increases, the inversion margin of the latch circuit 100 significantly deteriorates. When the threshold voltage Vth of each of the driver PMOS transistors MPDRP and MPDRN increases, the drive ability of the driver stage 102 significantly deteriorates. In the configuration of the first embodiment, the exceeded-breakdown-voltage prevention PMOS transistors MPE3P and MPE3N are provided to be able to prevent the property deterioration of the level shifter due to such FN degradation as described above.

In addition, the clamp NMOS transistors MNF1P and MNF1N for clamping the potentials at the intermediate nodes hhp and hhn are provided to allow the currents supplied to the exceeded-breakdown-voltage prevention PMOS transistors MPE3P and MPE3N to be adjusted. As a result, it is possible to adjust the lower limit voltage at the intermediate nodes hhp and hhn. Moreover, it is possible to prevent the voltages at the intermediate nodes hhp and hhn from excessively dropping due to leakages currents in the exceeded-breakdown-voltage prevention PMOS transistors MPE3P and MPE3N and consequently avoid the situation in which exceeded-breakdown-voltage prevention achieves no effect.

<Second Embodiment>

In the second embodiment, a description will be given of the case where control is performed such that, in a phase in which a write pulse is applied during a data write operation, the voltage VPPA is set to a high voltage of, e.g., about 11 V while, in a phase in which a write address is selected, the voltage VPPA is set to a voltage lower than 11 V. This is because, when the letch circuit is inverted with a high voltage being applied between the gate and the source of each of the PMOS transistors MPCCP and MPCCN included in the latch circuit 110, the PMOS transistors MPCCP and MPCCN may be broken.

As described in the first embodiment, by providing the additional exceeded-breakdown-voltage prevention PMOS transistors MPE3P and MPE3N, it is possible to apply the voltage VPPA having a higher value to the level shifter. However, when the voltage VPPA is reduced to a lower value to invert the latch circuit 110 as described above, it may be difficult to invert the latch circuit 110 due to the provision of the additional exceeded-breakdown-voltage prevention PMOS transistors MPE3P and MPE3N. As a result, it becomes difficult for the level shifter to output the correct output signals outp and outn in accordance with the input signals inp and inn.

Accordingly, in the second embodiment, a description will be given of a level shifter which allows the problem described above to be solved. Specifically, bypass paths which bypass the exceeded-breakdown-voltage prevention circuit 112 are provided in the level shifter stage 101.

[Control of Voltages for Memory Gate MG]

Figure 7:
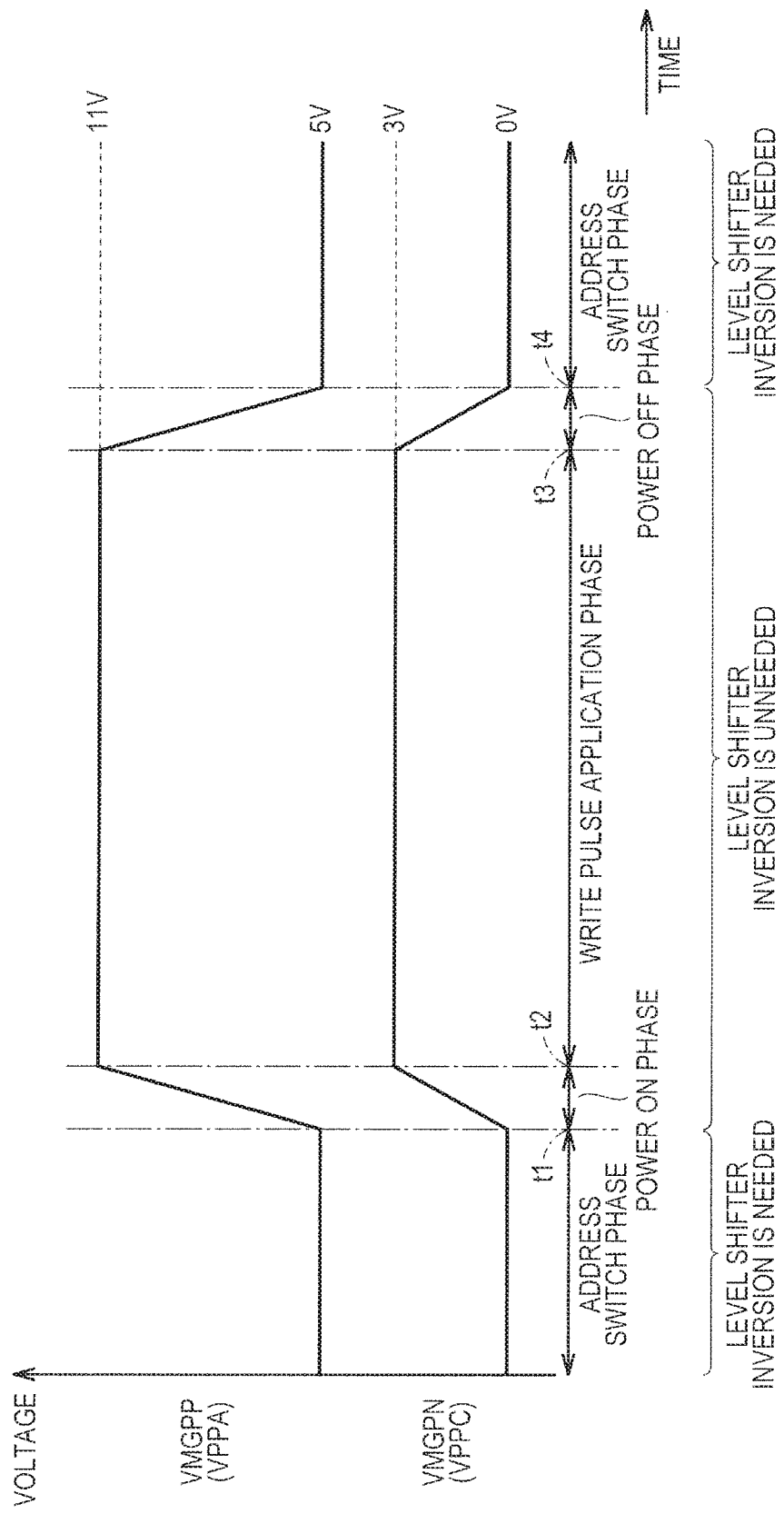
FIG. 7 is a timing chart showing an example of voltages applied to a memory gate MG shown in FIGS. 3A and 3B.

First, the following will describe control of voltages for the memory gate MG in the present second embodiment with reference to FIG. 7.

FIG. 7 is a timing chart showing an example of the voltages applied to the memory gate MG shown in FIGS. 3A and 3B.

The upper graph in FIG. 7 shows the time variation of the voltage VMGPP applied to the selected memory gate MG in the selected block during a write operation. The lower graph in FIG. 7 shows the time variation of the voltage VMGPN applied to the non-selected memory gate MG in the selected block during the write operation. As described using FIGS. 5A to 5D, the voltage applied to the selected memory gate MG is the high power supply voltage VPPA, while the voltage applied to the non-selected memory gate is the intermediate voltage VPPC. The values of the high power supply voltage VPPA and the intermediate voltage VPPC are varied by controlling the charge pump which generates the high power supply voltage VPPA and the intermediate voltage VPPC.

Referring to FIG. 7, before a time t1, the phase in which an address is selected and switched is established. In this phase, the voltage VMGPP (VPPA) applied to the selected memory gate MG is as low as about 5 V, while the voltage VMGPN (VPPC) applied to the non-selected memory gate MG is 0 V.

When the write operation is started, between the time t1 and a time t2, the voltage VMGPP at the selected memory gate MG is increased to a high level of about 11 V. On the other hand, the voltage VMGPN is increased to about 3 V for exceeded-breakdown-voltage prevention.

When the voltages VMGPP and VMGPN are stabilized at predetermined values between the time t2 and a time t3, the write pulse is applied. After the write operation is completed, between the time t3 and a time t4, the voltage VMGPP is reduced to about 5 V, while the voltage VMGPN is reduced to 0 V. After the time t4, the address switch phase is established again.

In the address switch phase, the latch circuit 110 may be inverted in accordance with the address. However, since the high power supply voltage VPPA is a relatively low voltage of about 5 V, exceeded-breakdown-voltage prevention is unneeded. Accordingly, as shown in FIG. 8 subsequent to FIG. 7, the switch is controlled to allow currents to flow in bypass paths 105 and 106 and thus prevent the exceeded-breakdown-voltage prevention circuit 112 from being used.

On the other hand, in each of a power ON phase (between the time t1 and the time t2), a write pulse application phase (between the time t2 and the time t3), and a power OFF phase (between the time t3 and the time t4), the internal state of the latch circuit 110 need not be changed, but exceeded-breakdown-voltage prevention is needed. In this case, the switch is controlled to allow a current to flow in the exceeded-breakdown-voltage prevention circuit 112, not in the bypass paths 105 and 106.

[Configuration of Level Shifter]

Figure 8:
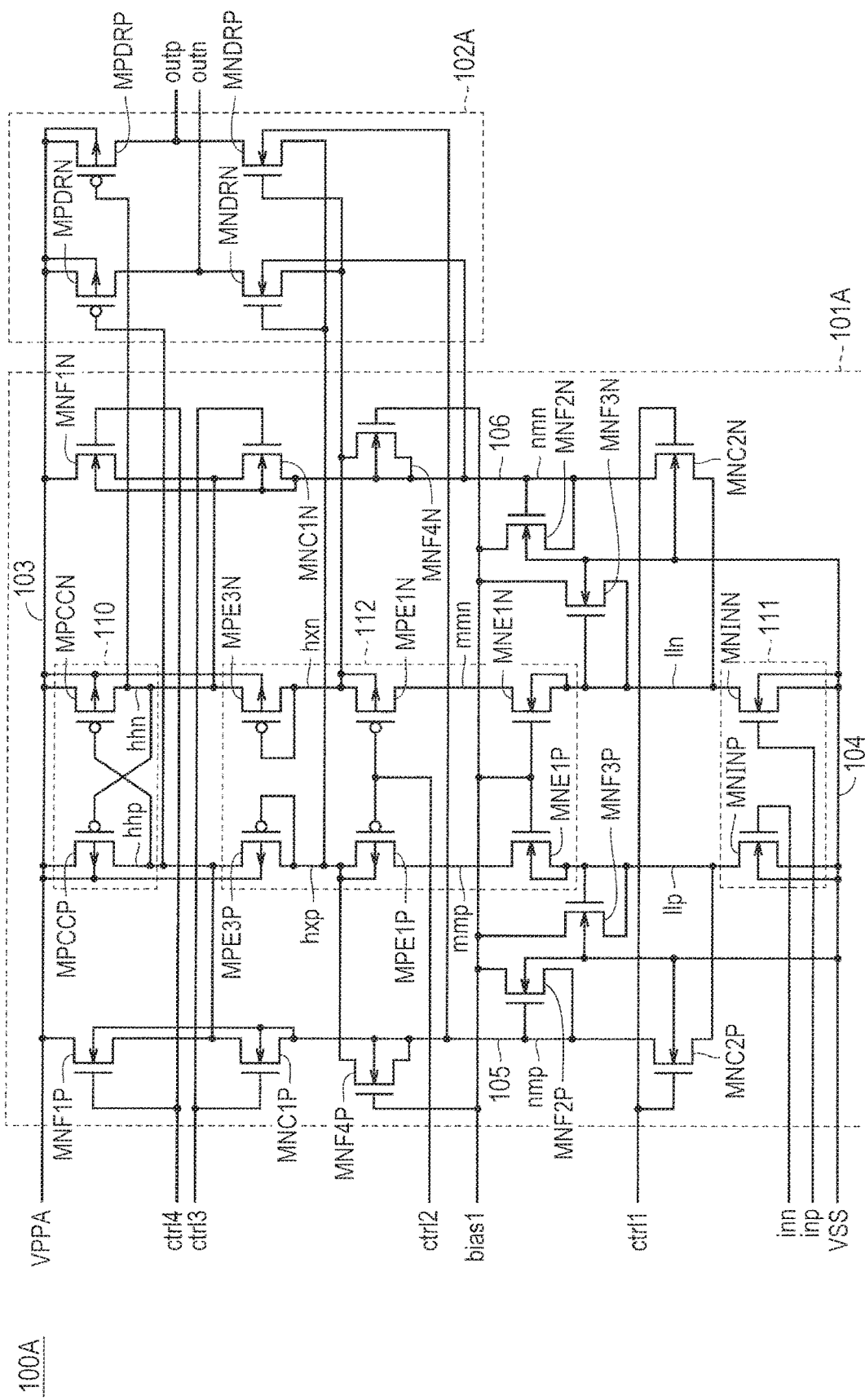
FIG. 8 is a circuit diagram showing a configuration of a level shifter in a semiconductor device in a second embodiment.

FIG. 8 is a circuit diagram showing a configuration of the level shifter in the semiconductor device in the second embodiment.

Referring to FIG. 8, a level shifter 100A includes a level shifter stage 101A and a driver stage 102A.

The level shifter stage 101A includes the level shifter stage 101 in FIG. 6 as a basic component and further includes the bypass paths 105 and 106 for bypassing the exceeded-breakdown-voltage prevention circuit 112. The bypass path 105 bypasses the exceeded-breakdown-voltage prevention circuit 112 and couples together the intermediate node hhp and the intermediate node 11p. The bypass path 106 bypasses the exceeded-breakdown-voltage prevention circuit 112 and couples together the intermediate node hhn and the intermediate node 11n.

The level shifter stage 101A is different from the level shifter stage 101 in FIG. 6 in that current path switching NMOS transistors MNC1P and MNC2P provided in the bypass path 105 and current path switching NMOS transistors MNC1N and MNC2N provided in the bypass path 106 are further included therein. In the following description, a node between the NMOS transistor MNC1P and the NMOS transistor MNC2P is referred to as an intermediate node nmp, and a node between the NMOS transistor MNC1N and the NMOS transistor MNC2N is referred to as an intermediate node nmn.

To the gate of each of the NMOS transistors MNC1P and MNC1N described above, a control signal ctrl3 is input while, to the gate of each of the NMOS transistors MNC2P and MNC2N, a control signal ctrl1 is input. The control signals ctrl1 and ctrl3 are intended for switching between the state where there is exceeded-breakdown-voltage prevention control and the state where there is no exceeded-breakdown-voltage prevention control. The respective back gates of the NMOS transistors MNC1P and MNC1N are coupled to the respective sources thereof. Each of the back gates of the NMOS transistors MNC2P and MNC2N is coupled to the ground node 104.

The level shifter stage 101A is also different from the level shifter stage 101 in FIG. 6 in that the input to each of the gates of the clamp NMOS transistors MNF1P and MNF1N is replaced by a control signal ctrl4 and the input to each of the gates of the exceeded-breakdown-voltage prevention PMOS transistors MPE1P and MPE1N is replaced by a control signal ctrl2. The control signals ctrl2 and ctrl4 are intended to switch the gate voltage depending on whether or not there is exceeded-breakdown-voltage prevention control. In addition, the level shifter stage 101A is modified such that the respective back gates of the clamp NMOS transistors MNF1P and MNF1N are coupled to the respective sources of the NMOS transistors MNC1P and MNC1N.

The level shifter stage 101A is also different from the level shifter stage 101 in FIG. 6 in that clamp NMOS transistors MNF4P, MNF4N, MNF3P, MNF3N, MNF2P, and MNF2N are further included therein. These NMOS transistors are intended not to float, but to fix a potential at an intermediate node in a current path which is not in use.

Specifically, the clamp NMOS transistor MNF4P is coupled between the intermediate node hxp and the bypass path 105. The clamp NMOS transistor MNF4N is coupled between the intermediate node hxn and the bypass path 106. To each of the gates of the clamp NMOS transistors MNF4P and MNF4N, a fixed bias voltage bias1 is given. As the bias voltage bias1, the intermediate voltage VPPR (e.g., 5.5 V) is used. The respective back gates of the clamp NMOS transistors MNF4P and MNF4N are coupled to the respective sources thereof.

Each of the clamp NMOS transistors MNF3P, MNF3N, MNF2P, and MNF2N is diode-coupled. The respective sources of the clamp NMOS transistors MNF3P, MNF3N, MNF2P, and MNF2N are coupled individually to the intermediate nodes 11p, 11n, nmp, and nmn. To each of the drains of the clamp NMOS transistors MNF3P, MNF3N, MNF2P, and MNF2N, the bias voltage bias1 is given. Each of the back gates of the clamp NMOS transistors MNF3P, MNF3N, MNF2P, and MNF2N is coupled to the ground node 104.

To reduce the number of elements, the driver stage 102A is configured to use an exceeded-breakdown-voltage prevention voltage in the level shifter stage 101A. Specifically, the driver stage 102A includes the driver PMOS transistors MPDRP and MPDRN and the driver NMOS transistors MNDRP and MNDRN. Unlike the driver stage 102 in FIG. 6, the driver stage 102A has none of the exceeded-breakdown-voltage prevention PMOS transistors MPE2P and MPE2N and the exceeded-breakdown-voltage prevention NMOS transistors MNE2P and MNE2N.

The coupling between the driver PMOS transistors MPDRP and MPDRN is the same as in the case of FIG. 6, and therefore the description thereof is not repeated. The respective drains of the driver NMOS transistors MNDRP and MNDRN are coupled to the respective drains of the driver PMOS transistors MPDRP and MPDRN. The respective gates of the driver NMOS transistors MNDRP and MNDRN are coupled respectively to the intermediate nodes hxn and hxp. The respective sources of the driver NMOS transistors MNDRP and MNDRN are coupled respectively to the intermediate nodes hxp and hxn. The respective back gates of the driver NMOS transistors MNDRP and MNDRN are coupled respectively to the intermediate nodes nmp and nmn.

[Operation of Level Shifter]

Next, a description will be given of the operation of the level shifter 100A in the semiconductor device in the second embodiment shown in FIG. 8.

(Set Values of Control Signals)

Table 2 shows the set values of the control signals ctrl1 to ctrl4 with/without exceeded-breakdown-voltage prevention control.

TABLE 2

| | Values of Control Signals | |
|---|---|---|
| | Without Exceeded-Breakdown-Voltage Prevention Control | With Exceeded-Breakdown-Voltage Prevention Control |
| ctrl1 | bias1 | VSS |
| ctrl2 | VSS | bias2 |
| ctrl3 | bias1 | bias2 |
| ctrl4 | VSS | bias1 |
| outp, outn | VPPA/VSS | VPPA/VPPC | bias1 = VPPR (5.5 V)
bias2 = VPPC (3.0 V)

It is assumed herein that the bias voltage bias1 is VPPR (e.g., 5.5 V) and a bias voltage bias2 is VPPC (e.g., 3.0 V). Each of the bias voltages bias1 and bias2 has a fixed value.

As shown in Table 2, the level shifter 100A is also configured such that the voltage levels of the output signals outp and outn from the level shifter 100A are switched depending on whether or not there is exceeded-breakdown-voltage prevention control. The HIGH (H or High) side voltage level is VPPA irrespective of whether or not there is exceeded-breakdown-voltage prevention control. However, the high power supply voltage VPPA has different magnitudes when there is exceeded-breakdown-voltage prevention control (e.g., 11 V) and when there is no exceeded-breakdown-voltage prevention control (e.g., 5 V). On the other hand, LOW (L or Low) side voltage level is the intermediate voltage VPPC (e.g., 3.0 V) when there is exceeded-breakdown-voltage prevention control and is the ground voltage VSS (e.g., 0 V) when there is no exceeded-breakdown-voltage prevention control.

As described above, by setting the HIGH side voltage level to the high power supply voltage VPPA, it is possible to reliably switch the PMOS switch 71 in FIG. 5A to the OFF state. On the other hand, by setting the LOW side voltage level to the ground voltage VSS when there is no exceeded-breakdown-voltage prevention control, it is possible to reliably switch the PMOS switch 71 in FIG. 5A to the ON state. Thus, to ensure the ability of the PMOS switch 71, the signal levels of the output signals outp and outn are switched depending on whether or not there is exceeded-breakdown-voltage prevention control.

Next, a description will be given of how to set the control signals ctrl1 to ctrl4 when there is exceeded-breakdown-voltage prevention control and when there is no exceeded-breakdown-voltage prevention control. For example, the control signals ctrl1 to ctrl4 are output from a control circuit such as the flash sequencer 37 in FIG. 1.

(Operation of Level Shifter with Exceeded-Breakdown-Voltage Prevention Control)

When there is exceeded-breakdown-voltage prevention control, the control circuit sets the control signal ctrl4 to VPPR (e.g., 5.5 V) and sets the control signal ctrl2 to VPPC (e.g., 3.0 V). Accordingly, the input voltage (VPPR) to each of the gates of the clamp NMOS transistors MNF1P and MNF1N and the input voltage (intermediate voltage VPPC) to each of the gates of the exceeded-breakdown-voltage prevention PMOS transistors MPE1P and MPE1N are the same as in the case of FIG. 6 in the first embodiment.

When there is exceeded-breakdown-voltage prevention control, the control circuit further sets the control signal ctrl1 to the ground voltage VSS. As a result, the NMOS transistors MNC2P and MNC2N are brought into the OFF state to cut off current paths via the bypass paths 105 and 106. Accordingly, the same exceeded-breakdown-voltage preventing effect as obtained in the first embodiment can be obtained.

When there is exceeded-breakdown-voltage prevention control, the intermediate nodes nmp and nmn of the bypass paths 105 and 106 are each charged to the VPPR level by the respective clamp NMOS transistors MNF4P and MNF4N. When voltages at the intermediate nodes nmp and nmn are each increased to a level of not less than VPPR, charges are extracted by the clamp NMOS transistors MNF2P and MNF2N till the VPPR level is reached. Thus, the voltages at the intermediate nodes nmp and nmn are fixed to the VPPR level. Also, when there is exceeded-breakdown-voltage prevention control, the control circuit sets the control signal ctrl3 to VPPC (e.g., 3.0 V). Thus, the individual voltages are set so as to prevent a breakdown voltage from being exceeded in each of the NMOS transistors MNC1P, MNC1N, MNC2P, and MNC2N.

The lowest voltage value at the intermediate nodes hxp and hxn when there is exceeded-breakdown-voltage prevention control is VPPC as the voltage value of the control signal ctrl2 given to each of the gates of the exceeded-breakdown-voltage prevention PMOS transistors MPE1P and MPE1N. Since the driver stage 102A has retrieved the voltages at the intermediate nodes hxp and hxn as negative side power supply voltages, the lower limit value of the output signals outp and outn is also VPPC.

(Operation of Level Shifter without Exceeded-Breakdown-Voltage Prevention Control)

On the other hand, when there is no exceeded-breakdown-voltage prevention control, the control circuit sets the control signal ctrl2 to the ground voltage VSS to disable the functions of the exceeded-breakdown-voltage prevention PMOS transistors MPE1P and MPE1N.

The control circuit also sets the control signal ctrl1 to the intermediate voltage VPPR to reliably bring the NMOS transistors MNC2P and MNC2N into the ON state. The control circuit also sets the control signal ctrl3 to the intermediate voltage VPPR to reliably bring the NMOS transistors MNC1P and MNC1N into the ON state. By thus setting the control signals ctrl1 and ctrl3, the bypass paths 105 and 106 are activated. The current path in which the exceeded-breakdown-voltage prevention circuit 112 intervenes is not positively cut, but does not substantially function when the high power supply voltage VPPA drops.

In the state described above, the level shifter stage 101A operates using the current path in which the cross-coupled PMOS transistor MPCCP, the bypass path 105, and the input NMOS transistor MNINP intervene and using the current path in which the cross-coupled PMOS transistor MPCCN, the bypass path 106, and the input NMOS transistor MNINN intervene. Each of the NMOS transistors MNC1P, MNC1N, MNC2P, and MNC2N functions as a mere switch. Accordingly, the level shifter stage 101A is equivalent to a simple cross-coupled level shifter which does not have an exceeded-breakdown-voltage preventing function.

The voltage at the intermediate node in the exceeded-breakdown-voltage prevention circuit 112 which is not used herein is limited by the clamp MOS transistor. This is because, when brought into a floating state, the voltage at the intermediate node may present an obstacle to the operation of the level shifter stage 101A.

Specifically, the voltages at the intermediate nodes $11p$ and $11n$ are respectively limited by the clamp NMOS transistors MNF3P and MNF3N to a level of not more than the bias voltage bias1 (i.e., VPPR). The intermediate nodes mmp and mmn are coupled directly to the intermediate nodes $11p$ and $11n$ via the exceeded-breakdown-voltage prevention NMOS transistors MNE1P and MNE1N.

The intermediate nodes hxp and hxn are respectively coupled to the intermediate nodes nmp and nmn via the clamp NMOS transistors MNF4P and mNF4N. As a result, the lower limit of the voltages at the intermediate nodes hxp and hxn is the ground voltage VSS. Since the intermediate nodes hxp and hxn give the negative side power supply voltages in the driver stage 102A, the lower limit voltage of the output signals outp and outn is also the ground voltage VSS.

When there is no exceeded-breakdown-voltage prevention control, the clamp NMOS transistors MNF1P and MNF1N are brought into a substantially OFF state. This is because the control signal ctrl4 supplied to each of the gates of the clamp NMOS transistors MNF1P and MNF1N is set to the ground voltage VSS, and the ground voltage VSS is the lowest voltage at the intermediate nodes hhp and hhn. As a result, the currents supplied to the PMOS transistors MPE3P and MPE3N when there is exceeded-breakdown-voltage prevention control are no longer needed when three is no exceeded-breakdown-voltage prevention control and can therefore be cut off.

<Effects of Second Embodiment>

According to the second embodiment, the bypass paths 105 and 106 which bypass the exceeded-breakdown-voltage prevention circuit 112 are provided between the latch circuit 110 and the input circuit 111. The bypass paths 105 and 106 can be switched between a conductive state and a non-conductive state by the switching NMOS transistors MNC1P, MNC1N, MNC2P, and MNC2N.

As a result, in the phase in which the write pulse is applied to the selected memory cell, the high power supply voltage VPPA is set to a high value and the bypass paths 105 and 106 are cut off to allow the level shifter 100A to operate in a state where there is exceeded-breakdown-voltage prevention control. On the other hand, in the phase where the write address is selected, the high power supply voltage VPPA is set to a low value and the bypass paths 105 and 106 are brought into the conductive state to allow the level shifter 100A to operate in the state where there is no exceeded-breakdown-voltage prevention control.

The foregoing switching of the bypass paths 105 and 106 between the conductive state and the cut-off state can be performed using the set voltages of the control signals ctrl1 to ctrl4, as described using Table 2. Specifically, in FIG. 7 described above, in the address switch phase (before the time t1 and after the time t1), the level shifter 100A is operated in the state where there is no exceeded-breakdown-voltage prevention control. Then, the control circuit switches the settings of the control signals ctrl1 to ctrl4 from the state where there is no exceeded-breakdown-voltage prevention control to the state where there is exceeded-breakdown-voltage prevention control with appropriate timing during a power ON period (e.g., at the first time t1 during the power ON period). Then, the control circuit switches the settings of the control signals ctrl1 to ctrl4 from the state where there is exceeded-breakdown-voltage prevention control to the state without there is no exceeded-breakdown-voltage prevention control with appropriate timing during a power OFF period (e.g., at the last time t4 during the power OFF period). Thus, in the phase (time t2 to time t4) in which the write pulse is applied to the selected memory cell, the level shifter 100A can be operated in the state where there is exceeded-breakdown-voltage prevention control.

The respective sources of the driver NMOS transistors MNDRP and MNDRN included in the driver stage 102A are coupled to the respective sources (i.e., intermediate nodes hxp and hxn) of the exceeded-breakdown-voltage prevention PMOS transistors MPE1P and MPE1N. Accordingly, even when the potentials at the intermediate nodes hhp and hhn are increased to prevent the respective breakdown voltages of the cross-coupled PMOS transistors MPCCP and MPCCN and the driver PMOS transistors MPDRP and MPDRN from being exceeded, the LOW level voltages of the output signals outp and outn remain unchanged. As a result, the operation margin of the circuit which receives the output signals outp and outn input thereto from the level shifter 100A is not reduced.

By contrast, in the case of a related art level shifter in which the exceeded-breakdown-voltage prevention PMOS transistors MPE3P and MPE3N are not provided, when the gate potentials of the exceeded-breakdown-voltage prevention PMOS transistors MPE1P and MPE1N are increased for exceeded-breakdown-voltage prevention, the potentials at the intermediate nodes hxp and hxn are increased to increase the LOW level voltages of the output signals outp and outn. As a result, the operation margin of the circuit which receives the output signal outp and outn input thereto from the level shifter 100A undesirably decreases.

Thus, in the case of the second embodiment, by providing the exceeded-breakdown-voltage prevention PMOS transistors MPE3P and MPE3N, it is possible to inhibit a reduction in the operation margin of the entire semiconductor circuit.

<Third Embodiment>

In each of the first and second embodiments, as the additional exceeded-breakdown-voltage prevention PMOS transistors MPE3P and MPE3N, the diode-coupled PMOS transistors are used. It is to be noted herein that an exceeded-breakdown-voltage prevention voltage (referred to also as a clamp voltage) depends on the gate potential of each of the exceeded-breakdown-voltage prevention PMOS transistors. In the case of the first and second embodiments, each of the exceeded-breakdown-voltage prevention PMOS transistors MPE3P and MPE3N is diode-coupled so that the gate potential is equal to the drain potential. Accordingly, to change the gate potential, the drain potential needs to be changed and, to change the drain potential, a current caused to flow in each of the exceeded-breakdown-voltage prevention PMOS transistors MPE3P and MPE3N needs to be changed. For the reason described above, in the case of the first and second embodiments, it is required to cause currents to constantly flow in the exceeded-breakdown-voltage prevention PMOS transistors MPE3P and MPE3N, resulting in the problem of high DC current consumption.

Also, in each of the first and second embodiments, to enhance an exceeded-breakdown-voltage preventing effect on the cross-coupled PMOS transistors MPCCP and MPCCN, it is required to increase the drain potentials of the exceeded-breakdown-voltage prevention PMOS transistors MPE3P and MPE3N. To satisfy the requirement, it is appropriate to reduce the currents caused to flow in the exceeded-breakdown-voltage prevention PMOS transistors MPE3P and MPE3N. However, when the high power supply voltage VPPA is reduced, the stability of the level shifter deteriorates. Accordingly, there may be a case where it is necessary to conversely reduce the drain potentials of the exceeded-breakdown-voltage prevention PMOS transistors MPE3P and MPE3N. In that case, a larger amount of DC current is consumed so that the range of adjustment of the exceeded-breakdown-voltage prevention voltage is limited.

In the third embodiment, to solve the problem described above, the coupling of the gates of the exceeded-breakdown-voltage prevention PMOS transistors MPE3P and MPE3N is changed. Referring to the drawings, a detailed description will be given below.

[Configuration of Level Shifter]

Figure 9:
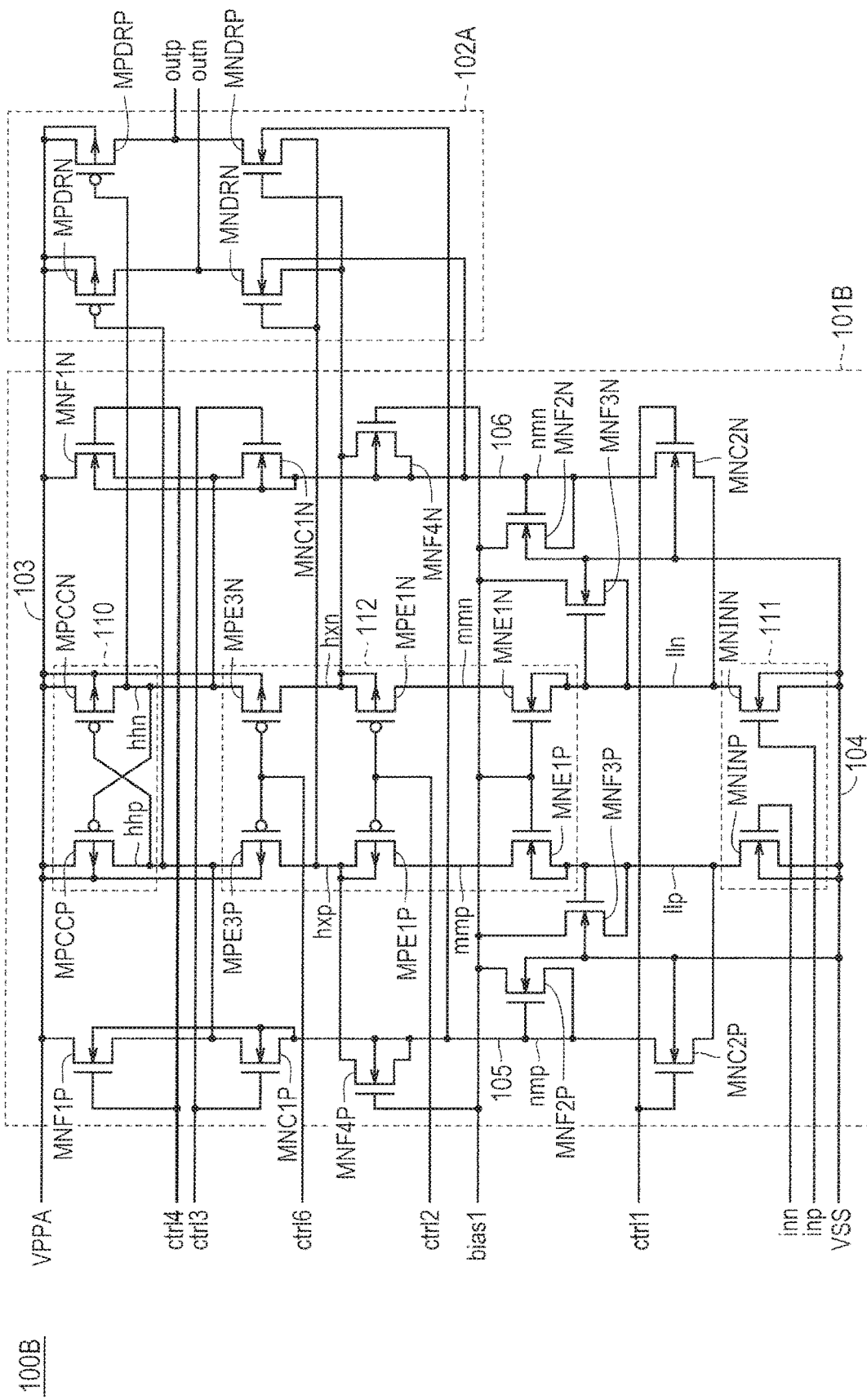
FIG. 9 is a circuit diagram showing a configuration of a level shifter in a semiconductor device in a third embodiment.

FIG. 9 is a circuit diagram showing a configuration of a level shifter in the semiconductor device in the third embodiment.

A level shifter 100B in FIG. 9 is different from the level shifter 100A shown in FIG. 8 in the coupling of the gates of the exceeded-breakdown-voltage prevention PMOS transistors MPE3P and MPE3N. Specifically, in the level shifter 100A in FIG. 8, each of the exceeded-breakdown-voltage prevention PMOS transistors MPE3P and MPE3N is diode-coupled while, in the level shifter 100B in FIG. 9, to each of the gates of the exceeded-breakdown-voltage prevention PMOS transistors MPE3P and MPE3N, a control signal ctrl6 is input from an external control circuit (e.g., flash sequencer 37 in FIG. 1).

In the configuration of the level shifter 100B described above, the exceeded-breakdown-voltage preventing effect on the cross-coupled PMOS transistors MPCCP and MPCCN can be adjusted using the voltage level of the control signal ctrl6. Since the control signal ctrl6 is given from the external control circuit, it is unnecessary to cause currents to steadily flow in the exceeded-breakdown-voltage prevention PMOS transistors MPE3P and MPE3N. Therefore, compared to the second embodiment, the third embodiment can reduce the DC current consumption.

For the reason described above, the clamp NMOS transistors MNF1P and MNF1N which are provided to cause currents to flow in the exceeded-breakdown-voltage prevention PMOS transistors MPE3P and MPE3N are basically unneeded. However, when there are leakage currents in the exceeded-breakdown-voltage prevention PMOS transistors MPE3P and MPE3N, the potential differences between the intermediate nodes hhp and hhn and the intermediate nodes hxp and hxn are reduced to reduce the exceeded-breakdown-voltage preventing effect. Accordingly, the clamp NMOS transistors MNF1P and MNF1N in FIG. 9 are provided to compensate for voltage reductions at the intermediate nodes hhp and hhn due to the leakage currents mentioned above. As a result, it is sufficient for the currents injected into the exceeded-breakdown-voltage prevention PMOS transistors MPE3P and MPE3N via the clamp NMOS transistors MNF1P and MNF1N to be significantly smaller than those in the cases of the first and second embodiments.

Since FIG. 9 is otherwise the same as FIG. 8, like or equivalent parts are given like reference numerals and the description thereof is not repeated. Note that the changing of the coupling of the respective gates of the exceeded-breakdown-voltage prevention PMOS transistors MPE3P and MPE3N described above is also applicable to the case in FIG. 6 in the first embodiment.

[Specific Voltage Values of Control Signal ctrl6 and Generation Circuit]

A description will be given of the specific voltage values of the control signal ctrl6.

During exceeded-breakdown-voltage prevention control, the lower limit value of the voltages at the intermediate nodes hxp and hxn is the voltage value (VPPC, e.g., 3.0 V) of the control signal ctrl2, and the lower limit value of the voltages at the intermediate nodes hhp and hhn is the voltage value of the control signal ctrl6. Therefore, to enhance the exceeded-breakdown-voltage preventing effect on the cross-coupled PMOS transistors MPCCP and MPCCN, it is necessary to satisfy ctrl6>VPPC.

On the other hand, under the clamping effect of the clamp NMOS transistors MNF1P and MNF1N, the voltages at the intermediate nodes hhp and hhn cannot be set higher than the voltage value (VPPR, e.g., 5.5 V) of the control signal ctrl4. Therefore, it is necessary to satisfy ctrl6<VPPR.

Accordingly, the voltage value of the control signal ctrl6 during exceeded-breakdown-voltage prevention control is between the value of the intermediate voltage VPPR and the value of the intermediate voltage VPPC. An example of a circuit which generates the control signal ctrl6 so as to satisfy this relationship is shown below.

Figure 10:
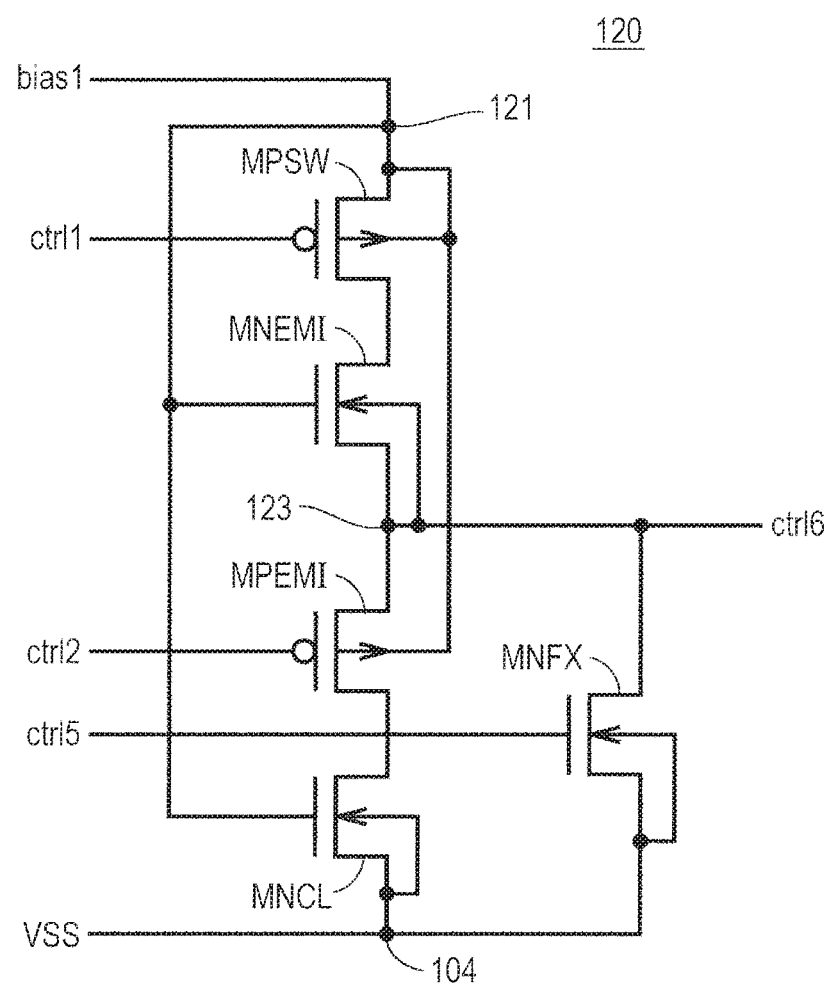
FIG. 10 is a view showing an example of a circuit which generates a control signal ctrl6 in FIG. 9.

FIG. 10 is a view showing an example of the circuit which generates the control signal ctrl6 in FIG. 9. Referring to FIG. 10, a control signal generation circuit 120 receives the bias voltage bias1 (intermediate voltage VPPR) and the bias voltage bias2 (intermediate voltage VPPC) which are input thereto and generates and outputs the control signal ctrl6 on the basis of these signals. Specifically, the control signal generation circuit 120 includes PMOS transistors MPSW and MPEMI and NMOS transistors MNEMI, MNCL, and MNFX. The following will describe coupling between the transistors mentioned above.

The PMOS transistor MPSW, the NMOS transistor MNEMI, the PMOS transistor MPEMI, and the NMOS transistor MNCL are arranged in this order and coupled in series between a power supply node 121 to which the bias voltage bias1 is input and the ground node 104. To the gate of the PMOS transistor MPSW, the control signal ctrl1 is input. To the gate of the PMOS transistor MPEMI, the control signal ctrl2 is input. To each of the gates of the NMOS transistors MNEMI and MNCL, the bias voltage bias1 is applied. Each of the back gates of the PMOS transistors MPSW and MPEMI is coupled to the power supply node 121. The respective back gates of the NMOS transistors MNEMI and MNCL are coupled to the respective sources thereof. The NMOS transistor MNFX is coupled between a coupling node 123 between the NMOS transistor MNEMI and the PMOS transistor MPEMI and the ground node 104. To the gate of the NMOS transistor MNFX, the control signal ctrl6 is input. The back gate of the NMOS transistor MNFX is coupled to the source thereof. From the coupling node 123 mentioned above, the control signal ctrl6 is output.

In the control signal generation circuit 120 having the foregoing configuration, the NMOS transistor MNCL is used as a clamp MOS transistor which prevents the PMOS transistor MPEMI from being coupled directly to the ground voltage VSS.

The PMOS transistor MPSW is used as a switch which switches the control signal ctrl6 between a valid state and an invalid state. When there is exceeded-breakdown-voltage prevention control, the control signal ctrl1 is set to the ground voltage VSS to bring the PMOS transistor MPSW into the ON state. When there is no exceeded-breakdown-voltage prevention control, the control signal ctrl1 is set to the bias voltage bias1 to bring the PMOS transistor MPSW into the OFF state.

The NMOS transistor MNFX is used as a pull-down NMOS transistor for fixing the coupling node 123 to the ground voltage VSS when the control signal ctrl6 is not used (i.e., when there is exceeded-breakdown-voltage prevention control and the exceeded-breakdown-voltage prevention PMOS transistors MPE3P and MPE3N are activated). Accordingly, when the exceeded-breakdown-voltage prevention PMOS transistors MPE3P and MPE3N are activated, the control circuit sets a control signal ctrl5 to the ground voltage VSS to turn OFF the NMOS transistor MNFX.

When the control signal ctrl6 is used, i.e., when the NMOS transistor MNFX is OFF, the voltage of the control signal ctrl6 is substantially determined by the size ratio between the NMOS transistor MNEMI and the PMOS transistor MPEMI.

Specifically, by the NMOS transistor MNEMI, the control signal ctrl6 is limited to a voltage value of not more than bias1 (VPPR)−Vthn, where Vthn is the threshold voltage of the NMOS transistor MNEMI. The control signal ctrl6 is further limited by the PMOS transistor MPEMI to a voltage value of not less than ctrl2 (VPPC). Accordingly, the voltage value of the control signal ctrl6 is in a range given by VPPC<ctrl6<VPPR−Vthn. When currents are increased by adjusting the sizes of the NMOS transistor MNEMI and the PMOS transistor MPEMI, the voltage value of the control signal ctrl6 approaches the lower limit (i.e., VPPC) of the range shown above. Conversely, when the currents are reduced, the voltage value of the control signal ctrl6 approaches the upper limit (i.e., VPPR−Vthn). Thus, it is possible to vary the voltage value of the control signal ctrl6 and adjust the exceeded-breakdown-voltage preventing effect.

Note that, when there is no exceeded-breakdown-voltage prevention control, the control circuit sets the control signal ctrl1 to VPPR to cut off the PMOS transistor MPSW and sets the control signal ctrl5 to VPPC to fix the control signal ctrl6 to the ground voltage VSS.

[Summary of Set Values and Effects of Control Signals ctrl1 to ctrl6]

Table 3 shows a summary of the set values of the control signals ctrl1 to ctrl6 in the individual operation modes.

TABLE 3

| | Values of Control Signals | | |
|---|---|---|---|
| | Without Exceeded-Breakdown-Voltage Prevention Control | With Loose Exceeded-Breakdown-Voltage Prevention Control | With Strict Exceeded-Breakdown-Voltage Prevention Control |
| ctrl1 | bias1 | VSS | VSS |
| ctrl2 | VSS | bias2 | bias2 |
| ctrl3 | bias1 | bias2 | bias2 |
| ctrl4 | VSS | bias1 | bias1 |
| ctrl5 | bias2 | bias2 | VSS |
| ctrl6 | VSS | VSS | bias3 | bias1 = VPPR (5.5 V)
bias2 = VPPC (3.0 V)
bias2 < bias3 < bias1

The operation modes include a mode without exceeded-breakdown-voltage prevention control, a mode with loose exceeded-breakdown-voltage prevention control, and a mode with strict exceeded-breakdown-voltage prevention control. Each of the mode with strict exceeded-breakdown-voltage prevention control and the mode with loose exceeded-breakdown-voltage prevention control corresponds to the state where exceeded-breakdown-voltage prevention control is effective. Specifically, the mode with strict exceeded-breakdown-voltage prevention control corresponds to the case where the control signal ctrl6 is valid (i.e., in the case where the control signal ctrl6 is within the range given by VPPC<ctrl6<VPPR−Vthn), resulting in the state where each of the exceeded-breakdown-voltage prevention PMOS transistors MPE3P and MPE3N in FIG. 9 has the exceeded-breakdown-voltage preventing effect. The mode with loose exceeded-breakdown-voltage prevention control corresponds to the case where the control signal ctrl6 is invalid (i.e., equal to the ground voltage VSS), resulting in the state where the exceeded-breakdown-voltage prevention PMOS transistors MPE3P and MPE3N are absent.

The switching of the control signal ctrl6 between the valid state and the invalid state can be performed using the control signal ctrl5. The other control signals ctrl1 and ctrl4 show no difference in the mode with loose exceeded-breakdown-voltage prevention control and in the mode with strict exceeded-breakdown-voltage prevention control. Accordingly, the set values of the control signals ctrl1 to ctrl4 are the same in the case of Table 2.

As described above, when the high power supply voltage VPPA is relatively high, the control circuit sets the control signal ctrl5 to the ground voltage VSS to activate the exceeded-breakdown-voltage prevention PMOS transistors MPE3P and MPE3N. This allows a higher exceeded-breakdown-voltage preventing effect to be obtained. On the other hand, when the high power supply voltage VPPA is relatively low, the control circuit sets the control signal ctrl5 to the bias voltage bias2 (VPPC) to inactivate the exceeded-breakdown-voltage prevention PMOS transistors MPE3P and MPE3N. This can enhance the operation stability of the level shifter 100B.

<Fourth Embodiment>

In the case of the third embodiment, among the PMOS transistors included in the level shifter 100B, the six elements, i.e., the cross-coupled PMOS transistors MPCCP and MPCCN, the exceeded-breakdown-voltage prevention PMOS transistors MPE3P and MPE3N, and the driver PMOS transistors MPDRP and MPDRN can provide a sufficient exceeded-breakdown-voltage preventing effect compared to that provided by the related art circuit. On the other hand, only the two elements, i.e., the exceeded-breakdown-voltage prevention PMOS transistors MPE1P and MPE1N can provide only the exceeded-breakdown-voltage preventing effect equivalent to that provided by the related art circuit.

More specifically, in the former six PMOS transistors, the maximum gate-source applied voltage is VPPA−bias3 (bias3 is the voltage value of the control signal ctrl6). On the other hand, in the latter exceeded-breakdown-voltage prevention PMOS transistors MPE1P and MPE1N, the maximum gate-source applied voltage is VPPA−bias2 (bias2=VPPC). Since the relationship given by bias2<bias3 is established, in the latter exceeded-breakdown-voltage prevention PMOS transistors MPE1P and MPE1N, a higher voltage is applied between the gate and the source.

As a result, a problem arises in that, to obtain a higher exceeded-breakdown-voltage prevention property, the exceeded-breakdown-voltage preventing effect on the exceeded-breakdown-voltage prevention PMOS transistors MPE1P and MPE1N is not sufficient. In a fourth embodiment, a description will be given of a level shifter 100C which solves the problem described above.

[Configuration of Level Shifter]

Figure 11:
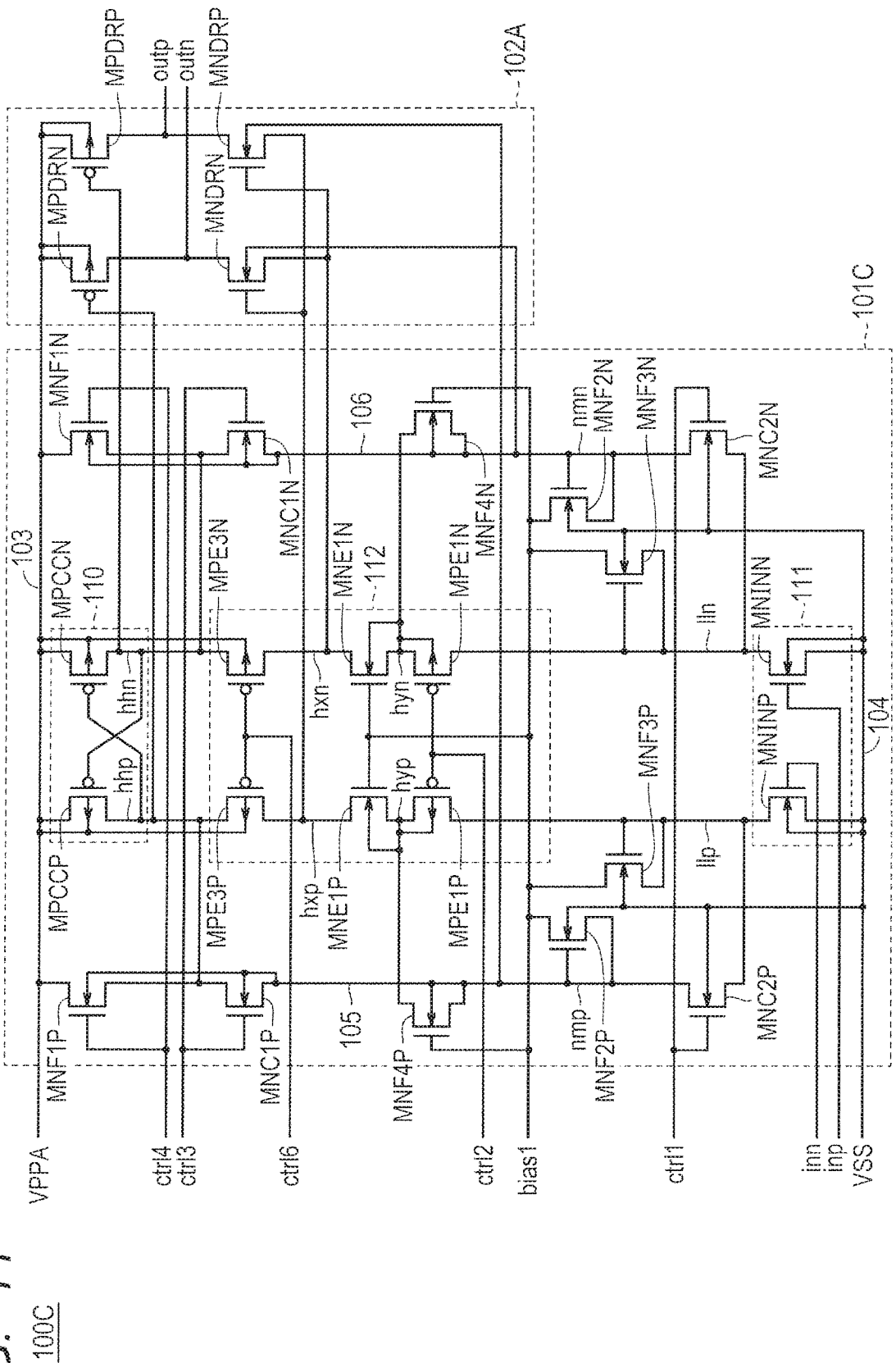
FIG. 11 is a circuit diagram showing a configuration of a level shifter in a semiconductor device in a fourth embodiment.

FIG. 11 is a circuit diagram showing a configuration of a level shifter in a semiconductor device in the fourth embodiment. The level shifter 100C in FIG. 11 includes a level shifter stage 101C and the driver stage 102A. A configuration of the driver stage 102A is the same as in the case of FIGS. 8 and 9, and therefore the description thereof is not repeated. A configuration of the level shifter stage 101C is obtained by partly modifying the level shifter stage 101B in FIG. 9.

The exceeded-breakdown-voltage prevention circuit 112 in the level shifter stage 101C is different from that in the case of the third embodiment (i.e., the exceeded-breakdown-voltage prevention circuit 112 in FIG. 9) in terms of the layout of the exceeded-breakdown-voltage prevention NMOS transistors MNE1P and MNE1N. Specifically, in the case of FIG. 11, the exceeded-breakdown-voltage prevention NMOS transistor MNE1P is disposed between the exceeded-breakdown-voltage prevention PMOS transistor MPE3P and the exceeded-breakdown-voltage prevention PMOS transistor MPE1P and coupled in series to the exceeded-breakdown-voltage prevention PMOS transistors MPE3P and MPE1P. Likewise, the exceeded-breakdown-voltage prevention NMOS transistor MNE1N is disposed between the exceeded-breakdown-voltage prevention PMOS transistor MPE3N and the exceeded-breakdown-voltage prevention PMOS transistor MPE1N and coupled in series to the exceeded-breakdown-voltage prevention PMOS transistors MPE3N and MPE1N.

To each of the gates of the exceeded-breakdown-voltage prevention NMOS transistors MNE1P and MNE1N, the bias voltage bias1 (VPPR) is given. The respective back gates of the exceeded-breakdown-voltage prevention NMOS transistors MNE1P and MNE1N are coupled to the respective sources thereof. The coupling between these exceeded-breakdown-voltage prevention NMOS transistors is the same as in the case of FIG. 9.

Note that, in the description related to FIG. 11, the respective coupling nodes between the exceeded-breakdown-voltage prevention PMOS transistors MPE3P and MPE3N and the exceeded-breakdown-voltage prevention NMOS transistors MNE1P and MNE1N are referred to as intermediate nodes hxp and hxn. The respective coupling nodes between the exceeded-breakdown-voltage prevention NMOS transistors MNE1P and MNE1N and the exceeded-breakdown-voltage prevention PMOS transistors MPE1P and MPE1N are referred to as intermediate nodes hyp and hyn. The respective coupling nodes between the exceeded-breakdown-voltage prevention PMOS transistors MPE1P and MPE1N and the input NMOS transistors MNINP and MNINN are referred to as the intermediate nodes 11$p$ and 11$n$.

In FIG. 11, the drain of the clamp NMOS transistor MNF4P is coupled to the intermediate node hyp, instead of the intermediate hxp. The drain of the clamp NMOS transistor MNF4N is coupled to the intermediate node hyn, instead of the intermediate node hxn.

The configuration in FIG. 11 is otherwise the same as in the case of FIG. 9, and therefore the description thereof is not repeated.

[Operation of Level Shifter]

The level shifter 100C in FIG. 11 has the configuration obtained by disposing the exceeded-breakdown-voltage prevention NMOS transistors MNE1P and MNE1N on the higher-potential side of the exceeded-breakdown-voltage prevention PMOS transistors MPE1P and MPE1N which present a problem in terms of exceeded-breakdown-voltage prevention in the level shifter 100B in FIG. 9. To each of the gates of the exceeded-breakdown-voltage prevention NMOS transistors MNE1P and MNE1N, the bias voltage bias1 (VPPR) is applied.

In the case of FIG. 9 described above, the maximum voltage at the sources (i.e., intermediate nodes hxp and hxn) of the exceeded-breakdown-voltage prevention PMOS transistors MPE1P and MPE1N is the high power supply voltage VPPA. For example, when the PMOS transistor MPCCP is in the ON state, the respective potentials at the intermediate node hhp and the intermediate node hxp are equal to the potential (VPPA) at the high-voltage node 103. By contrast, in the case of FIG. 11, the maximum voltage at the sources (i.e., intermediate nodes hyp and hyn) of the exceeded-breakdown-voltage prevention PMOS transistors MPE1P and MPE1N is the bias voltage bias1 (VPPR), which is significantly lower than the high power supply voltage VPPA. Thus, the maximum voltage applied to the exceeded-breakdown-voltage prevention PMOS transistors MPE1P and MPE1N is reduced from VPPA to VPPR.

The minimum voltage at the intermediate nodes hyp and hyn when the exceeded-breakdown-voltage prevention circuit 112 is active (i.e., when there is exceeded-breakdown-voltage prevention control) is bias2 (VPPC) as the voltage value of the control signal ctrl2. When it is assumed that VPPR=5.5 V and VPPC=3.0 V are satisfied by way of example, a gate-source voltage Vgs in each of the exceeded-breakdown-voltage prevention NMOS transistors MNE1P and MNE1N is VPPR−VPPC (=about 2.5 V). As a result, the exceeded-breakdown-voltage prevention NMOS transistors MNE1P and MNE1N can reliably be controlled into the ON state, which presents no obstacle when a required current is caused to flow in the exceeded-breakdown-voltage prevention circuit 112.

[Effects of Fourth Embodiment]

By adopting the configuration of the exceeded-breakdown-voltage prevention circuit 112 in the level shifter 100C shown in FIG. 11, the exceeded-breakdown-voltage preventing effect is exerted on all the PMOS transistors in the current paths in the level shifter 100C. As a result, it is possible to inhibit the degradation of the threshold voltage of each of the PMOS transistors when the PMOS transistor receives a FN stress and provide a level shifter having higher resistance to FN degradation.

<Fifth Embodiment>

In the first to fourth embodiments, the level shifter used in the high-voltage switch circuit described using FIG. 5 is assumed. Accordingly, in the state where there is exceeded-breakdown-voltage prevention control (i.e., when the high power supply voltage VPPA is set at a high voltage), the level shifter need not be inverted.

However, in a control circuit provided in a power supply circuit which generates the high power supply voltage VPPA, the need arises to invert the level shifter in the state where the high power supply voltage VPPA is relatively high and exceeded-breakdown-voltage prevention control is effective. A fifth embodiment will describe an example of a configuration of a level shifter which can be inverted in the state where the exceeded-breakdown-voltage prevention control is effective.

[Configuration of Level Shifter]

Figure 12:
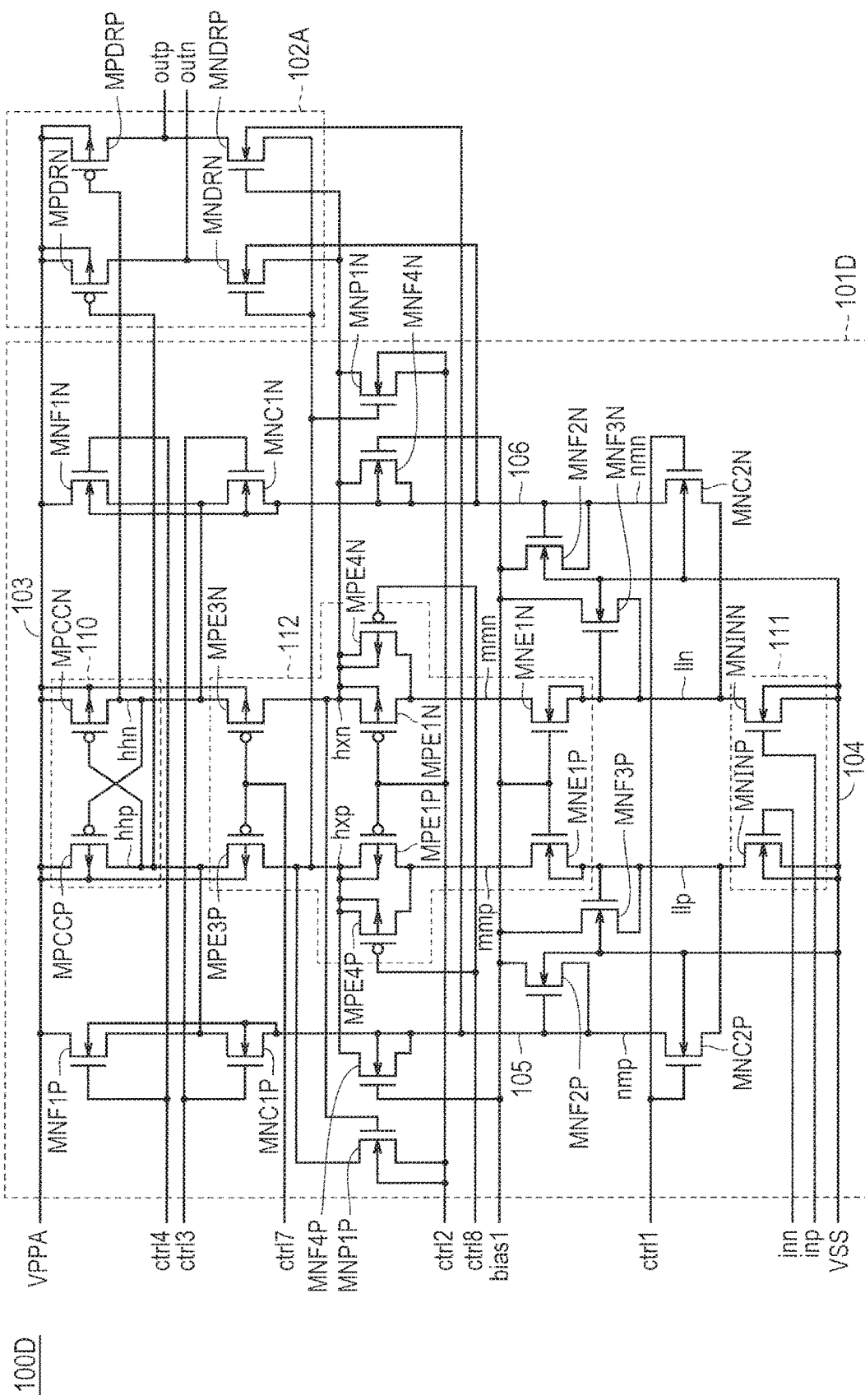
FIG. 12 is a circuit diagram showing a configuration of a level shifter in a semiconductor device in a fifth embodiment.

FIG. 12 is a circuit diagram showing a configuration of the level shifter in a semiconductor device in the fifth embodiment. A level shifter 100D in FIG. 12 is obtained by modifying the level shifter 100B in FIG. 9.

Specifically, the level shifter 100D in FIG. 12 is different from the level shifter 100B in FIG. 9 in that the input signal to each of the gates of the exceeded-breakdown-voltage prevention PMOS transistors MPE3P and MPE3N is changed from the control signal ctrl6 to a control signal ctrl7. In contrast to the voltage value of the control signal ctrl6 which is fixed when exceeded-breakdown-voltage prevention control is effective, the voltage value of the control signal ctrl7 is characterized by varying in accordance with the high power supply voltage VPPA (i.e., as the high power supply voltage VPPA increases, the control signal ctrl7 increases).

In addition, the exceeded-breakdown-voltage prevention circuit 112 in the level shifter 100D in FIG. 12 is different from the exceeded-breakdown-voltage prevention circuit 112 in the level shifter 100B in FIG. 9 in that exceeded-breakdown-voltage prevention PMOS transistors MPE4P and MPE4N coupled in parallel to the exceeded-breakdown-voltage prevention PMOS transistors MPE1P and MPE1N are further included therein. To each of the gates of the exceeded-breakdown-voltage prevention PMOS transistors MPE4P and MPE4N mentioned above, a control signal ctrl8 is input. The respective back gates of the exceeded-breakdown-voltage prevention PMOS transistors MPE4P and MPE4N are coupled to the respective sources thereof.

The voltage value of the control signal ctrl2 input to each of the gates of the exceeded-breakdown-voltage prevention PMOS transistors MPE1P and MPE1N is fixed to the value of the bias voltage bias2 (VPPC) when exceeded-breakdown-voltage prevention control is effective. By contrast, the voltage value of the control signal ctrl8 input to each of the gates of the newly added exceeded-breakdown-voltage prevention PMOS transistors MPE4P and MPE4N is characterized by varying in accordance with the high power supply voltage VPPA (i.e., as the high power supply voltage VPPA increases, the control signal ctrl8 increases). This allows the exceeded-breakdown-voltage preventing effects of the exceeded-breakdown-voltage prevention PMOS transistors MPE1P and MPE1N to be reduced when the high power supply voltage VPPA drops.

In the example shown in FIG. 13 described later, each of the control signals ctrl7 and ctrl8 described above varies in proportion to the high power supply voltage VPPA. For example, each of the control signals ctrl7 and ctrl8 is generated by dividing the high power supply voltage VPPA. In this example, the voltage value of the control signal ctrl8 is between the voltage value of the control signal ctrl7 and the value of the ground voltage VSS.

The level shifter 100D in FIG. 12 is different from the level shifter 100B in FIG. 9 in that NMOS transistors MNP1P and MNP1N are further included therein. Specifically, the NMOS transistor MNP1P has a drain coupled to the intermediate node hxp, a gate coupled to the intermediate node hxn, and a source and a back gate to which the control signal ctrl2 is input. The NMOS transistor MNP1N has a drain coupled to the intermediate node hxn, a gate coupled to the intermediate node hxp, and a source and a back gate to which the control signal ctrl2 is input.

The NMOS transistors MNP1P and MNP1N having the foregoing configuration can pull down the lower limit voltage at the intermediate nodes hxp and hxn to the intermediate voltage VPPC. This allows the lower limit voltage of the output signals outp and outn to be held at the intermediate voltage VPPC irrespective of the set value of the high power supply voltage VPPA.

Note that, without the NMOS transistors MNP1P and MNP1N, the lower limit voltage of the output signals outp and outn is higher than VPPC by about 1 V at most. The NMOS transistors MNP1P and MNP1N can be omitted when practical use thereof presents no problem.

Since the configuration in FIG. 12 is otherwise the same as in the case of FIG. 9, like or equivalent parts are given like reference numerals and the description thereof is not repeated.

[Control Signal Generation Circuit]

Figure 13:
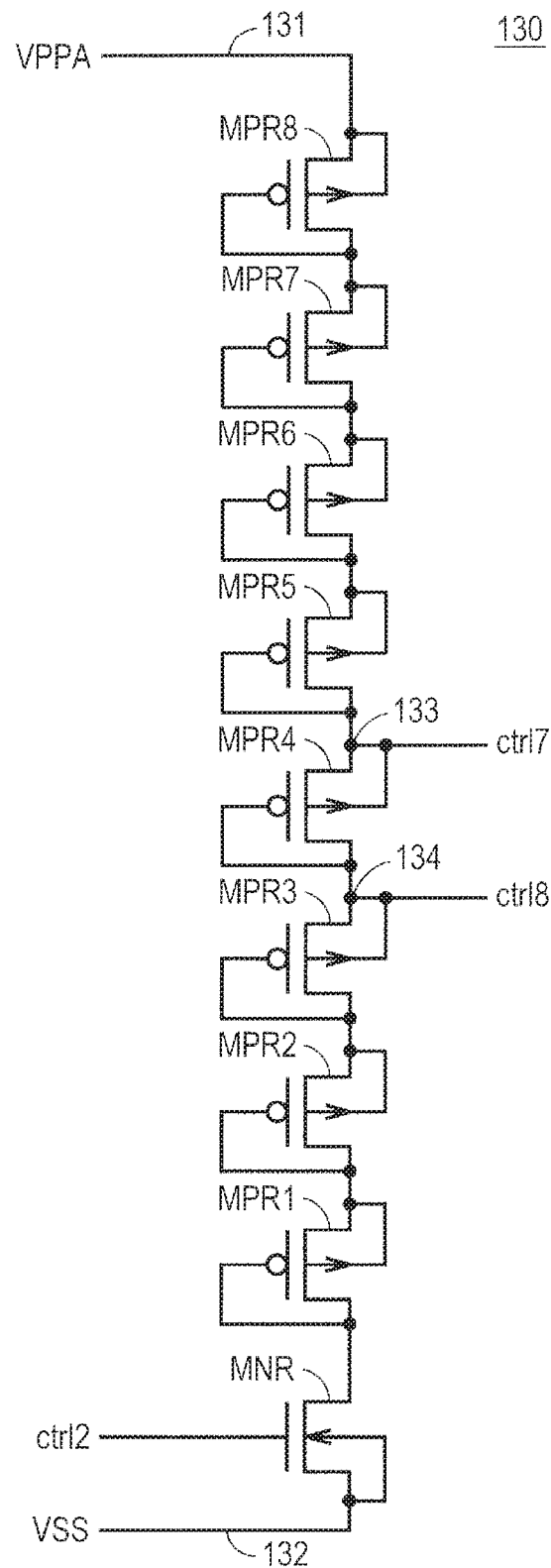
FIG. 13 is a view showing an example of a circuit which generates control signals ctrl7 and ctrl8 in FIG. 12.

FIG. 13 is a view showing an example of a circuit which generates the control signals ctrl7 and ctrl8 in FIG. 12.

Referring to FIG. 13, a control signal generation circuit 130 is configured as a voltage division circuit which divides the high power supply voltage VPPA. To a higher-potential power supply node 131 of the voltage division circuit, the high power supply voltage VPPA is given while, to a lower-potential power supply node 132 thereof, the ground voltage VSS is given. The control signal ctrl6 is output from a voltage division node 133 between the higher-potential power supply node 131 and the lower-potential power supply node 132, while the control signal ctrl8 is output from a voltage division node 134 between the voltage division node 133 and the lower-potential power supply node 132.

Specifically, in the example shown in FIG. 13, the control signal generation circuit 130 includes eight PMOS transistors MPR1 to MPR8 each diode-coupled and coupled in series to each other and an NMOS transistor MNR coupled between the drain of the PMOS transistor MPR1 and the lower-potential power supply node 132. The NMOS transistor MNR is used as a switch. The source of the PMOS transistor MPR8 is coupled to the higher-potential power supply node 131. To the gate of the NMOS transistor MNR, the control signal ctrl2 is input. In each of the MOS transistors, the back gate and the source are coupled together.

The coupling node between the PMOS transistor MPR4 and the PMOS transistor MPR5 serves as the voltage division node 133 and outputs the control signal ctrl7. The coupling node between the PMOS transistor MPR3 and the PMOS transistor MPR4 serves as the voltage division node 134 and outputs the control signal ctrl8.

Next, a description will be given of the operation of the control signal generation circuit 130 having the foregoing configuration. When exceeded-breakdown-voltage prevention control is effective, the voltage value of the control signal ctrl2 is set to the bias voltage bias2 (VPPC) to bring the NMOS transistor MNR into the ON state. At this time, the voltage value of the control signal ctrl7 is (½)×VPPA, while the voltage value of the control signal ctrl8 is (⅜)× VPPA.

On the other hand, when exceeded-breakdown-voltage prevention control is ineffective, the voltage value of the control signal ctrl2 is set to the ground voltage VSS to bring the NMOS transistor MNR into the OFF state. In this case, each of the control signals ctrl7 and ctrl8 is fixed to the high power supply voltage VPPA.

[Factor which Inhibits Inversion of Level Shifter]

Before the operation of the level shifter 100D in FIG. 12 is described, first, a description will be given of a reason why it is difficult to invert the level shifter 100B in FIG. 9 corresponding to FIG. 12 in the state where exceeded-breakdown-voltage prevention control is effective.

Referring to FIG. 9, when the logic levels of the input signals inp and inn are inverted, the ON/OFF states of the input NMOS transistors MNINP and MNINN included in the input circuit 111 are changed. At this time, the currents flowing in the input NMOS transistors MNINP and MNINN extract charges from the intermediate nodes hhp and hhn. As a result, the ON/OFF states of the cross-coupled PMOS transistors MPCCP and MPCCN included in the latch circuit 110 are changed. In other words, the level shifter 100B is inverted.

Accordingly, to improve the inversion property, it is important to increase the current in the current path coupling together the latch circuit 110 and the input circuit 111. However, in a level shifter of exceeded-breakdown-voltage prevention type as shown in FIG. 9, the exceeded-breakdown-voltage prevention circuit 112 (particularly the exceeded-breakdown-voltage prevention PMOS transistors MPE1P, MPE1N, MPE3P, and MPE3N) configure a factor which inhibits an increase in the current in the current path mentioned above.

Specifically, a problem lies in that, when the latch circuit 110 is inverted, the high power supply voltage VPPA should be reduced to an extent to prevent the cross-coupled PMOS transistors MPCCP and MPCCN from exceeding an ON breakdown voltage. On the other hand, each of the gate voltages (ctrl2 or the control signal ctrl6) of the exceeded-breakdown-voltage prevention PMOS transistors MPE1P, MPE1N, MPE3P, and MPE3N) is set at a rather high value to allow a sufficient exceeded-breakdown-voltage preventing effect to be obtained when the high power supply voltage VPPA has an upper limit value. Accordingly, when the high power supply voltage VPPA is reduced without changing the set values of the gate voltages of the exceeded-breakdown-voltage prevention PMOS transistors MPE1P, MPE1N, MPE3P, and MPE3N, each of the cross-coupled PMOS transistors MPCCP and MPCCN cannot have a sufficient gate-source voltage. As a result, the latch circuit 110 cannot be inverted.

To avoid the problem described above, in the level shifter 100D shown in FIG. 12, the gate voltage (ctrl7) of each of the exceeded-breakdown-voltage prevention PMOS transistors MPE3P and MPE3N and the gate voltage (ctrl8) of each of the exceeded-breakdown-voltage prevention PMOS transistors MPE4P and MPE4N change in proportion to the high power supply voltage VPPA. Specifically, when the high power supply voltage VPPA decreases, the voltage values of the control signals ctrl7 and ctrl8 also decrease.

[Operation of Level Shifter]

Table 4 shows a summary of the set values of the control signals ctrl1 to ctrl4, ctrl7, and ctrl8 with/without exceeded-breakdown-voltage prevention control.

TABLE 4

| | Values of Control Signals | |
|---|---|---|
| | Without Exceeded-Breakdown-Voltage Prevention Control | With Exceeded-Breakdown-Voltage Prevention Control |
| ctrl1 | bias1 | VSS |
| ctrl2 | VSS | bias2 |
| ctrl3 | bias1 | bias2 |
| ctrl4 | VSS | bias1 |
| ctrl7 | VPPA | (½)*VPPA |
| ctrl8 | VPPA | (⅜)*VPPA | bias1 = VPPR (5.5 V)
bias2 = VPPC (3.0 V)

The following will describe the operation of the level shifter 100D in FIG. 12 on the basis of Table 4. Note that the numerical values in Table 4 and the following description are exemplary and not restrictive.

Also, as shown in Table 4, the following will separately describe the case (1) where there is exceeded-breakdown-voltage prevention control and the case (2) where there is no exceeded-breakdown-voltage prevention control. In the case (1) where there is exceeded-breakdown-voltage prevention control, the control signals ctrl7 and ctrl8 vary in proportion to the high power supply voltage VPPA so that a description will be given separately of three cases depending on the value of the high power supply voltage VPPA. Specifically, there are the three cases, i.e., the case (1.1) where the high power supply voltage VPPA is about 11 V, the case (1.2) where the high power supply voltage VPPA is reduced to about 8 V, and the case (1.3) where the high power supply voltage VPPA is not more than 6 V.

As will be described below in detail, in the case (1.1), the voltage applied to the MOS transistor is over the ON breakdown voltage, and therefore the level shifter cannot be inverted. On the other hand, in each of the cases (1.2) and (1.3), the level shifter can be inverted. However, in the case (1.2), the exceeded-breakdown-voltage prevention PMOS transistors MPE1P and MPE1N form a main current path while, in the case (1.3), the exceeded-breakdown-voltage prevention PMOS transistors MPE4P and MPE4N form a main current path.

The case (1.1) will be described in which there is exceeded-breakdown-voltage prevention control and the high power supply voltage VPPA is about 11 V.

In this case, the voltage value of the control signal ctrl7 is about 5.5 V (11 V×½). Thus, the voltage higher than the voltage value of the control signal ctrl6 in the level shifter 100B in FIG. 9 is supplied to each of the gates of the exceeded-breakdown-voltage prevention PMOS transistors MPE3P and MPE3N. As a result, the exceeded-breakdown-voltage preventing effect on the cross-coupled PMOS transistors MPCCP and MPCCN is higher than in the case in FIG. 9, while the inversion margin of the level shifter 100D is narrower.

On the other hand, the maximum value of the voltages applied to the individual MOS transistors included in the level shifter 100D is about VPPA (11 V)−VPPC (3 V)=8 V. The voltage value is over the ON breakdown voltage (about 7 V) of the MOS transistor. Accordingly, irrespective of the size of the inversion margin of the level shifter 100D, the level shifter 100D cannot be inverted in terms of the ON breakdown voltage.

The case (1.2) will be described in which there is exceeded-breakdown-voltage prevention control and the high power supply voltage VPPA is reduced to about 8 V.

In this case, the maximum value of the voltages applied to the individual MOS transistors included in the level shifter 100D is about VPPA (8 V)−VPPC (3 V)=5 V. Since the voltage value is lower than the ON breakdown voltage (about 7 V) of the MOS transistor, the level shifter 100D can be inverted in terms of the ON breakdown voltage.

On the other hand, the voltage value of the control signal ctrl7 supplied to each of the gates of the exceeded-breakdown-voltage prevention PMOS transistors MPE3P and MPE3N is about 4 V (8 V×½). Accordingly, the exceeded-breakdown-voltage preventing effect on the cross-coupled PMOS transistors MPCCP and MPCCN is reduced compared to that in the case of the level shifter 100B in FIG. 9. However, since the current flowing in the exceeded-breakdown-voltage prevention circuit 112 can be increased, it is possible to invert the level shifter 100B.

The case (1.3) will be described in which there is exceeded-breakdown-voltage prevention control and the high power supply voltage VPPA is not more than 6 V.

In this case, the voltage value of the control signal ctrl7 is not more than 3 V (6 V×½). As a result, the exceeded-breakdown-voltage prevention PMOS transistors MPE1P and MPE1N each having the gate voltage having a fixed value (ctrl2) present an obstacle in allowing a current to flow in the exceeded-breakdown-voltage prevention circuit 112. To avoid the problem, the exceeded-breakdown-voltage prevention PMOS transistors MPE4P and MPE4N are provided in parallel with the respective exceeded-breakdown-voltage prevention PMOS transistors MPE1P and MPE1N. Since the voltage value of the control signal ctrl8 supplied to each of the gates of the exceeded-breakdown-voltage prevention PMOS transistors MPE4P and MPE4N is not more than 2.25 V (6 V×⅜), currents are allowed to flow in the exceeded-breakdown-voltage prevention PMOS transistors MPE4P and MPE4N. Therefore, it is possible to invert the level shifter 100B.

The case (2) will be described in which there is no exceeded-breakdown-voltage prevention control. In this case, the control circuit sets the voltage value of the control signal ctrl7 to VPPA to bring the exceeded-breakdown-voltage prevention PMOS transistors MPE3P and MPE3N into the OFF state. The control circuit also sets the control signal ctrl8 to VPPA to bring the exceeded-breakdown-voltage prevention PMOS transistors MPE4P and MPE4N into the ON state. The set values of the control signals ctrl1 to ctrl4 are the same as in the case of the second embodiment described using Table 2 and the third embodiment described using Table 3. Accordingly, the operation of the level shifter 100D when there is no exceeded-breakdown-voltage prevention control is the same as in the cases of the second and third embodiments.

[About Effects of NMOS transistors MNP1P and MNP1N]

The following will supplementally describe the effects of the NMOS transistors MNP1P and MNP1N.

If the NMOS transistors MNP1P and MNP1N are absent, a path into which charges are extracted from the intermediate nodes hxp and hxn is either a first path in which the exceeded-breakdown-voltage prevention PMOS transistors MPE1P and MPE1N intervene or a second path in which the exceeded-breakdown-voltage prevention PMOS transistors MPE4P and MPE4N intervene. In the case of the first path, the lower limit voltage at the intermediate nodes hxp and hxn is ctrl2+Vthp (Vthp is the threshold voltage of the PMOS transistor). In the case of the second path, the lower limit voltage at the intermediate nodes hxp and hxn is ctrl8+Vthp. Accordingly, the final lower limit voltage at the intermediate nodes hxp and hxn has a value obtained by adding Vthp to the smaller one of the voltage values of the control signals ctrl2 and ctrl8. When the high power supply voltage VPPA is set at a value of not less than 8 V, the lower limit voltage at the intermediate nodes hxp and hxn is about ctrl2+Vthp=VPPC+Vthp=VPPC+1 V.

On the other hand, by providing the NMOS transistors MNP1P and MNP1N, charges can be extracted from the intermediate nodes hxp and hxn via the NMOS transistors MNP1P and MNP1N. As a result, the lower limit voltage at the intermediate nodes hxp and hxn can be held at VPPC. Since the lower limit voltage of the output signals outp and outn is determined by the voltages at the intermediate nodes hxp and hxn, the lower limit voltage of the output signals outp and outn can consequently be held at VPPC.

[Effects of Fifth Embodiment]

According to the fifth embodiment, by using the control signals ctrl7 and ctrl8 proportional to the high power supply voltage VPPA, it is possible to allow an operation of inverting the level shifter to be performed within a relatively wide setting range of the high power supply voltage VPPA, while retaining a sufficient exceeded-breakdown-voltage preventing effect.

<Sixth Embodiment>

In the same manner as in the case of the third embodiment, in the case of the fifth embodiment also, the six elements, i.e., the cross-coupled PMOS transistors MPCCP and MPCCN, the exceeded-breakdown-voltage prevention PMOS transistors MPE3P and MPE3N, and the driver PMOS transistors MPDRP and MPDRN among the PMOS transistors included in the level shifter 100D can provide a sufficient exceeded-breakdown-voltage preventing effect compared to that provided by the related art circuit. On the other hand, only the two elements, i.e., the exceeded-breakdown-voltage prevention PMOS transistors MPE1P and MPE1N can provide only an exceeded-breakdown-voltage preventing effect equal to that provided by the related art circuit.

The exceeded-breakdown-voltage prevention PMOS transistors MPE4P and MPE4N newly added in the fifth embodiment have a maximum gate-source applied voltage given by VPPA−ctrl8=VPPA−(⅜)×VPPA=(⅝)×VPPA. Accordingly, when the high power supply voltage VPPA is set at 11 V, the maximum applied voltage is 6.857 V, and an exceeded-breakdown-voltage preventing effect equal to those provided by the other PMOS transistors except for the exceeded-breakdown-voltage prevention PMOS transistors MPE1P and MPE1N can be obtained.

The consideration given above shows that, in the same manner as in the case of the third embodiment, an insufficient exceeded-breakdown-voltage preventing effect on the exceeded-breakdown-voltage prevention PMOS transistors MPE1P and MPE1N presents a problem in obtaining a higher exceeded-breakdown-voltage prevention property. In the sixth embodiment, a description will be given of a level shifter 100E which solves the problem described above. Specifically, the same measures as described in the fourth embodiment are taken for the level shifter 100D in FIG. 12.

[Configuration of Level Shifter]

Figure 14:
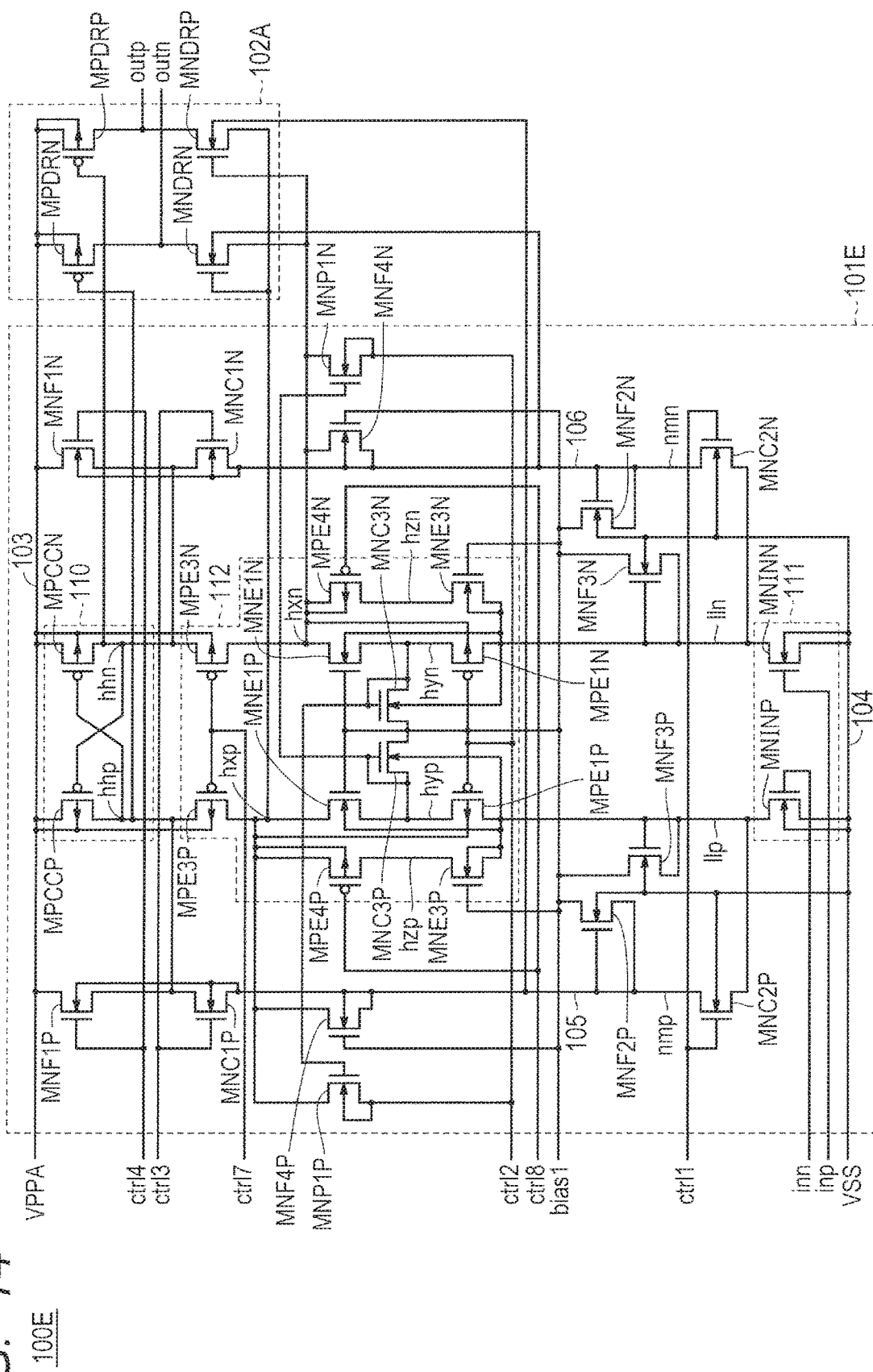
FIG. 14 is a circuit diagram showing a configuration of a level shifter in a semiconductor device in a sixth embodiment.

FIG. 14 is a circuit diagram showing a configuration of a level shifter in a semiconductor device in a sixth embodiment. The level shifter 100E in FIG. 14 includes a level shifter stage 101E and the driver stage 102A. A configuration of the driver stage 102A is the same as in the cases of FIGS. 8, 9, 11, and 12, and therefore the description thereof is not repeated. A configuration of the level shifter stage 101E is obtained by partly modifying the level shifter stage 101D in FIG. 12.

The exceeded-breakdown-voltage prevention circuit 112 in the level shifter stage 101E is different from that in the case of the fifth embodiment (i.e., the exceeded-breakdown-voltage prevention circuit 112 in FIG. 12) in terms of the layout of the exceeded-breakdown-voltage prevention NMOS transistors MNE1P and MNE1N. Specifically, in the case of FIG. 14, the exceeded-breakdown-voltage prevention NMOS transistor MNE1P is disposed between the exceeded-breakdown-voltage prevention PMOS transistor MPE3P and the exceeded-breakdown-voltage prevention PMOS transistor MPE1P and coupled in series to the exceeded-breakdown-voltage prevention PMOS transistors MPE3P and MPE1P. Likewise, the exceeded-breakdown-voltage prevention NMOS transistor MNE1N is disposed between the exceeded-breakdown-voltage prevention PMOS transistor MPE3N and the exceeded-breakdown-voltage prevention PMOS transistor MPE1N and coupled in series to the exceeded-breakdown-voltage prevention PMOS transistors MPE3N and MPE1N.

To each of the gates of the exceeded-breakdown-voltage prevention NMOS transistors MNE1P and MNE1N, the bias voltage bias1 (VPPR) is given. The respective back gates of the exceeded-breakdown-voltage prevention NMOS transistors MNE1P and MNE1N are coupled respectively to the intermediate nodes 11p and 11n. The respective back gates of the exceeded-breakdown-voltage prevention PMOS transistors MPE1P and MPE1N are coupled respectively to the intermediate nodes hxp and hxn.

Note that, in the description related to FIG. 14, the respective coupling nodes between the exceeded-breakdown-voltage prevention PMOS transistors MPE3P and MPE3N and the exceeded-breakdown-voltage prevention NMOS transistors MNE1P and MNE1N are referred to as the intermediate nodes hxp and hxn. The respective coupling nodes between the exceeded-breakdown-voltage prevention NMOS transistors MNE1P and MNE1N and the exceeded-breakdown-voltage prevention PMOS transistors MPE1P and MPE1N are referred to as the intermediate nodes hyp and hyn. The respective coupling nodes between the exceeded-breakdown-voltage prevention PMOS transistors MPE1P and MPE1N and the input NMOS transistors MNINP and MNINN are referred to as the intermediate nodes 11p and 11n.

The exceeded-breakdown-voltage prevention circuit 112 in the level shifter stage 101E is different from the exceeded-breakdown-voltage prevention circuit 112 in FIG. 12 in that the exceeded-breakdown-voltage prevention NMOS transistors MNE3P and MNE3N coupled to the respective drains of the exceeded-breakdown-voltage prevention PMOS transistors MPE4P and MPE4N are further included therein. Specifically, in FIG. 14, a series-coupled body including the exceeded-breakdown-voltage prevention PMOS transistor MPE4P and the exceeded-breakdown-voltage prevention NMOS transistor MNE3P is coupled in parallel to a series-coupled body including the exceeded-breakdown-voltage prevention NMOS transistor MNE1P and the exceeded-breakdown-voltage prevention PMOS transistor MPE1P. Likewise, a series-coupled body including the exceeded-breakdown-voltage prevention PMOS transistor MPE4N and the exceeded-breakdown-voltage prevention NMOS transistor MNE3N is coupled in parallel to a series-coupled body including the exceeded-breakdown-voltage prevention NMOS transistor MNE1N and the exceeded-breakdown-voltage prevention PMOS transistor MPE1N.

In each of the newly added exceeded-breakdown-voltage prevention NMOS transistors MNE3P and MNE3N, the bias voltage bias1 is applied to the gate, and the back gate is coupled to the source. In the description related to FIG. 14, the respective coupling nodes between the exceeded-breakdown-voltage prevention PMOS transistors MPE4P and MPE4N and the exceeded-breakdown-voltage prevention NMOS transistors MNE3P and MNE3N are referred to as intermediate nodes hzp and hzn.

The level shifter stage 101E in FIG. 14 further includes clamp NMOS transistors MNC3P and MNC3N coupled between the respective intermediate nodes hyp and hyn and the bias voltage bias1. In each of the clamp NMOS transistors MNC3P and MNC3N, the drain and the gate are coupled together, and the bias voltage bias1 is applied to the source. The respective back gates of the clamp NMOS transistors MNC3P and MNC3N are coupled to the respective intermediate nodes 11p and 11n. The clamp NMOS transistors MNC3P and MNC3N are provided so as to extract high voltages from the intermediate nodes hyp and hyn.

Note that, in FIG. 14, the node to which the gate of the NMOS transistor MNP1P is coupled is changed from the intermediate node hxn to the intermediate node hyn, while the node to which the gate of the NMOS transistor MNP1N is coupled is changed from the intermediate node hxp to the intermediate node hyp.

Since the configuration in FIG. 14 is otherwise the same as in the case of FIG. 12, like or equivalent parts are given like reference numerals and the description thereof is not repeated.

[Operation of Level Shifter]

In the case of the level shifter 100D in FIG. 12, the maximum voltage at the respective sources (i.e., intermediate nodes hxp and hxn) of the exceeded-breakdown-voltage prevention PMOS transistors MPE1P and MPE1N is VPPA. By contrast, in the case of the level shifter 100E in FIG. 14, the maximum voltage at the respective sources (i.e., intermediate nodes hyp and hyn) of the exceeded-breakdown-voltage prevention PMOS transistors MPE1P and MPE1N is VPPR. Thus, the maximum voltage applied to the exceededbreakdown-voltage prevention PMOS transistors MPE1P and MPE1N can significantly be reduced from VPPA to VPPR. The effect is the same as in the case of the fourth embodiment.

The maximum voltage at the respective drains (i.e., intermediate nodes hzp and hzn) of the exceeded-breakdown-voltage prevention PMOS transistors MPE4P and MPE4N is VPPA. To prevent the voltage from being unintentionally transmitted to the intermediate nodes hyp and hyn, the exceeded-breakdown-voltage prevention NMOS transistors MNE3P and MNE3N are provided to isolate the intermediate node hzp from the intermediate node hyp and isolate the intermediate node hzn from the intermediate node hyn.

When a voltage higher than VPPR is temporarily applied to each of the intermediate nodes hyp and hyn, charges are released from the intermediate nodes hyp and hyn through the respective clamp NMOS transistors MNC3P and MNC3N till the voltage at each of the intermediate nodes hyp and hyn is equal to VPPR (bias1).

[Effects of Sixth Embodiment]

By adopting the configuration of the exceeded-breakdown-voltage prevention circuit 112 in the level shifter 100E shown in FIG. 14, it is possible to exert the exceeded-breakdown-voltage preventing effect on all the PMOS transistors in the current paths in the level shifter 100E. As a result, it is possible to inhibit the degradation of the threshold voltage of each of the PMOS transistors when the PMOS transistor receives a FN stress and provide a level shifter having higher resistance to FN degradation.

<Seventh Embodiment>

In the first to sixth embodiments, as the input signals inp and inn to the level shifters 100A to 100E, VDD level control signals such as the selection signal selpp_a are assumed, where VDD is a low voltage of, e.g., about 1.5 V. Accordingly, to invert the latch circuit 110 in each of the level shifters 100A to 100E, it is necessary to increase the sizes of the input NMOS transistors MNINP and MNINN and thus allow sufficient currents to flow. Therefore, in the seventh embodiment, a description will be given of a configuration of a level shifter which can ensure a larger inversion margin.

[Configuration of Level Shifter]

Figure 15:
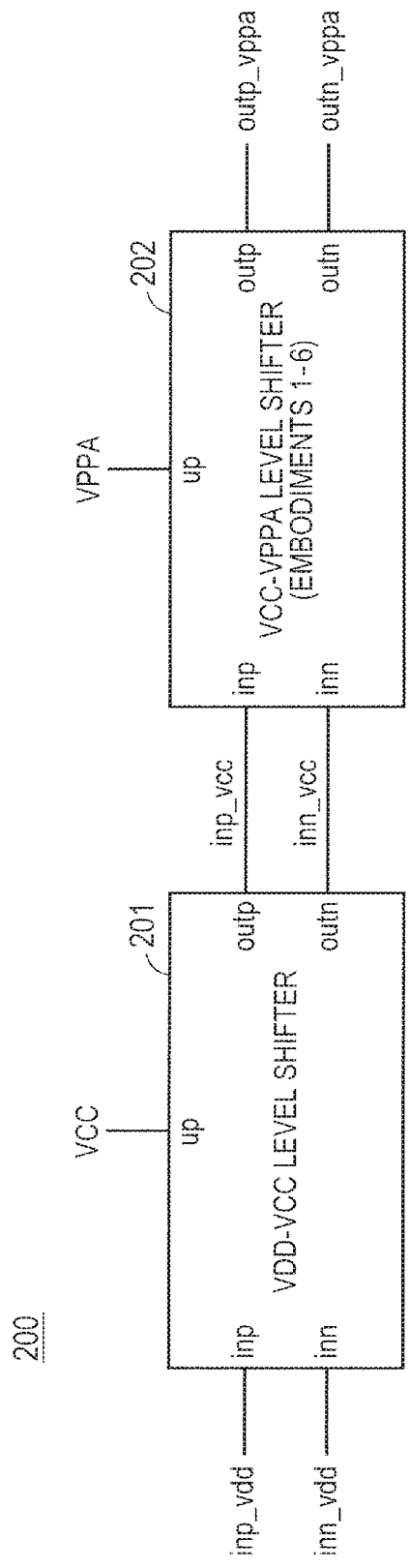
FIG. 15 is a block diagram showing a configuration of a level shifter in a semiconductor device in a seventh embodiment.

FIG. 15 is a block diagram showing a configuration of a level shifter in a semiconductor device in the seventh embodiment.

A level shifter 200 in FIG. 15 includes a VDD-VCC level shifter 201 which converts VDD level differential input signals inp_vdd and inn_vdd to VCC level signals and a VCC-VPPA level shifter 202 which converts VCC level differential input signals inp_vcc and inn_vcc to VPPA level signals. The differential signals output from the level shifter 201 provided in a stage previous to the level shifter 202 are input as the input signals inp_vcc and inn_vcc to the level shifter 202.

In the seventh embodiment, VCC is a voltage of, e.g., about 3 V. In a semiconductor integrated circuit in which a digital circuit and an analog circuit are embedded in mixed relation, e.g., VDD is supplied as a power supply voltage to the digital circuit from the outside, while VCC is supplied as a power supply voltage to the analog circuit from the outside.

As the VCC-VPPA level shifter 202 mentioned above, each of the level shifters 100 and 100A to 100E described in the first to sixth embodiments can be used without alteration. As the VDD-VCC level shifter 201, a cross-coupled level shifter having a simple configuration including no exceeded-breakdown-voltage prevention circuit can be used.

Figure 16:
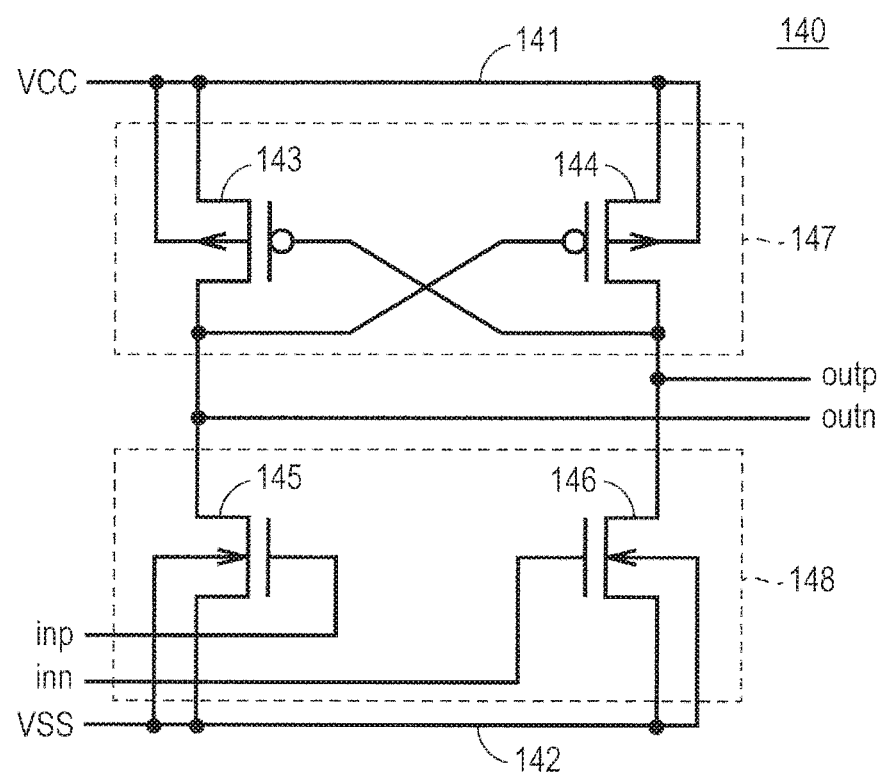
FIG. 16 is a circuit diagram showing an example of a configuration of the VDD-VCC level shifter in FIG. 15.

FIG. 16 is a circuit diagram showing an example of a configuration of the VDD-VCC level shifter in FIG. 15. Referring to FIG. 16, a VDD-VCC level shifter 140 includes a power supply node 141 to which the power supply voltage VCC is input, a ground node 142 to which the ground voltage VSS is input, a latch circuit 147, and an input circuit 148 to which the differential input signals inp and inn are input.

The latch circuit 110 includes a pair of cross-coupled PMOS transistors 143 and 144 having respective sources coupled to the power supply node 141. The PMOS transistors 143 and 144 have respective gates and drains cross-coupled together. Specifically, the gate of the PMOS transistor 143 is coupled to the drain of the PMOS transistor 144, while the drain of the PMOS transistor 143 is coupled to the gate of the PMOS transistor 144.

The input circuit 148 includes a pair of input NMOS transistors 145 and 146. Each of the sources of the input NMOS transistors 145 and 146 is coupled to the ground node 142. To the gate of the input NMOS transistor 145, the input signal inp is input while, to the gate of the input NMOS transistor 146, the input signal inn is input.

The drain of the input NMOS transistor 146 and the drain of the PMOS transistor 144 are coupled together to function as an output node which outputs the output signal outp. Likewise, the drain of the input NMOS transistor 145 and the drain of the PMOS transistor 143 are coupled together to function as an output node which outputs the output signal outn.

[Effects of Seventh Embodiment]

The level shifter 200 having the configuration described above converts the VDD level input signals to the VCC level signals using the previous-stage level shifter 201. To the subsequent-stage level shifter 202, the VCC level signals are input. This allows the subsequent-stage level shifter 202 to obtain a sufficient inversion margin without increasing the sizes of the input NMOS transistors MNINP and MNINN.

<Modifications>

Even when the conductivity type of each of the MOS transistors is changed from the P-type to the N-type or from the N-type to the P-type in the level shifters 100 and 100A to 100E described above in the first to sixth embodiments and the high power supply voltage VPPA, the intermediate voltage VPPR, the intermediate voltage VPPC, and the like are changed from positive values to negative values, the same function/effect as described above is achieved.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:
1. A semiconductor device, comprising:
a level shifter,
wherein the level shifter includes:
a latch circuit including a pair of first-conductivity-type cross-coupled transistors each coupled to a first power supply node to which a high power supply voltage is input;
an input circuit including a pair of second-conductivity-type transistors each coupled to a second power supply node to which a reference voltage is input and having respective gates that receive complementary input signals to the level shifter; and an exceeded-breakdown-voltage prevention circuit coupled between the latch circuit and the input circuit,
wherein the exceeded-breakdown-voltage prevention circuit includes:
a first-conductivity-type first exceeded-breakdown-voltage prevention transistor having a gate that receives a first intermediate voltage which is between the high power supply voltage and the reference voltage;
a second-conductivity-type second exceeded-breakdown-voltage prevention transistor having a gate that receives a second intermediate voltage which is between the high power supply voltage and the reference voltage and coupled in series to the first exceeded-breakdown-voltage prevention transistor; and
a first-conductivity-type third exceeded-breakdown-voltage prevention transistor coupled in series to the first and second exceeded-breakdown-voltage prevention transistors between the first and second exceeded-breakdown-voltage prevention transistors and the latch circuit, and
wherein the level shifter further includes a first-conductivity-type clamp transistor coupled between a coupling node between the third exceeded-breakdown-voltage prevention transistor and the latch circuit and the first power supply node.

2. The semiconductor device according to claim 1, wherein the second intermediate voltage is between the high power supply voltage and the first intermediate voltage.

3. The semiconductor device according to claim 2, wherein, to a gate of the third exceeded-breakdown-voltage prevention transistor, a third intermediate voltage is applied, and
wherein the third intermediate voltage is between the first intermediate voltage and the second intermediate voltage.

4. The semiconductor device according to claim 3, further comprising:
a first voltage generation circuit for generating the third intermediate voltage,
wherein the first voltage generation circuit includes:
a third power supply node to which the second intermediate voltage is given;
an output node for outputting the third intermediate voltage;
a second-conductivity-type first transistor coupled between the third power supply node and the output node and having a gate that receives the second intermediate voltage; and
a first-conductivity-type second transistor coupled between the output node and the second power supply node and having a gate that receives the first intermediate voltage.

5. The semiconductor device according to claim 4, wherein the first voltage generation circuit further includes:
a first switch coupled in parallel to the second transistor between the output node and the second power supply node, and
wherein, when the first switch is brought into an ON state, to the gate of the third exceeded-breakdown-voltage prevention transistor, the reference voltage is supplied instead of the third intermediate voltage.

6. The semiconductor device according to claim 2, wherein, to a gate of the third exceeded-breakdown-voltage prevention transistor, a fourth intermediate voltage is applied, and
wherein the fourth intermediate voltage is between the high power supply voltage and the reference voltage and increases as the high power supply voltage increases.

7. The semiconductor device according to claim 6, wherein the fourth intermediate voltage is generated by dividing the high power supply voltage.

8. The semiconductor device according to claim 6, wherein the first exceeded-breakdown-voltage prevention transistor is coupled between the second exceeded-breakdown-voltage prevention transistor and the third exceeded-breakdown-voltage prevention transistor,
wherein the exceeded-breakdown-voltage prevention circuit further includes:
a first-conductivity-type fourth exceeded-breakdown-voltage prevention transistor coupled in parallel to the first exceeded-breakdown-voltage prevention transistor and having a gate that receives a fifth intermediate voltage, and
wherein the fifth intermediate voltage is between the fourth intermediate voltage and the reference voltage and increases as the high power supply voltage increases.

9. The semiconductor device according to claim 8, wherein the fifth intermediate voltage is generated by dividing the high power supply voltage.

10. The semiconductor device according to claim 6, wherein the second exceeded-breakdown-voltage prevention transistor is coupled between the first exceeded-breakdown-voltage prevention transistor and the third exceeded-breakdown-voltage prevention transistor,
wherein the exceeded-breakdown-voltage prevention circuit further includes:
a first-conductivity-type fourth exceeded-breakdown-voltage prevention transistor coupled in parallel to a series-coupled body including the second exceeded-breakdown-voltage prevention transistor and the third exceeded-breakdown-voltage prevention transistor and having a gate that receives a fifth intermediate voltage, and
wherein the fifth intermediate voltage is between the fourth intermediate voltage and the reference voltage and increases as the high power supply voltage increases.

11. The semiconductor device according to claim 10, wherein the fifth intermediate voltage is generated by dividing the high power supply voltage.

12. The semiconductor device according to claim 8, wherein the exceeded-breakdown-voltage prevention circuit further includes:
a second-conductivity-type fifth exceeded-breakdown-voltage prevention transistor coupled in series to the fourth exceeded-breakdown-voltage prevention transistor between the fourth exceeded-breakdown-voltage prevention transistor and the input circuit and coupled in parallel to a series-coupled body including the second exceeded-breakdown-voltage prevention transistor and the third exceeded-breakdown-voltage prevention transistor.

13. The semiconductor device according to claim 2, wherein the third exceeded-breakdown-voltage prevention transistor is diode-coupled.

14. The semiconductor device according to claim 2,
wherein the level shifter further includes:
a bypass path which bypasses the exceeded-breakdown-voltage prevention circuit to couple together the latch circuit and the input circuit; and
a second switch provided in the bypass path to switch the bypass path between a conductive state and a non-conductive state.

15. The semiconductor device according to claim 2,
wherein the second exceeded-breakdown-voltage prevention transistor is coupled between the first exceeded-breakdown-voltage prevention transistor and the third exceeded-breakdown-voltage prevention transistor.

16. The semiconductor device according to claim 1,
wherein the semiconductor device further includes:
a previous-stage level shifter that converts a signal on a first voltage level to a signal on a second voltage level higher than the first voltage level, and
wherein the input signal to the level shifter is the signal resulting from the conversion by the previous-stage level shifter.

17. A semiconductor device, comprising:
a level shifter,
wherein the level shifter includes:
a latch circuit including a pair of first-conductivity-type cross-coupled transistors each coupled to a first power supply node to which a high power supply voltage is input;
an input circuit including a pair of second-conductivity-type transistors each coupled to a second power supply node to which a reference voltage is input and having respective gates that receive complementary input signals to the level shifter; and
an exceeded-breakdown-voltage prevention circuit coupled between the latch circuit and the input circuit,
wherein the exceeded-breakdown-voltage prevention circuit includes:
a first-conductivity-type first exceeded-breakdown-voltage prevention transistor having a gate that receives a first intermediate voltage which is between the high power supply voltage and the reference voltage;
a second-conductivity-type second exceeded-breakdown-voltage prevention transistor having a gate that receives a second intermediate voltage which is between the high power supply voltage and the first intermediate voltage and coupled in series to the first exceeded-breakdown-voltage prevention transistor; and
a first-conductivity-type third exceeded-breakdown-voltage prevention transistor coupled in series to the first and second exceeded-breakdown-voltage prevention transistors between the first and second exceeded-breakdown-voltage prevention transistors and the latch circuit,
wherein the third exceeded-breakdown-voltage prevention transistor has a gate to which a third intermediate voltage is applied,
wherein the third intermediate voltage is between the first intermediate voltage and the second intermediate voltage, and
wherein the level shifter further includes a first-conductivity-type clamp transistor coupled between a coupling node between the third exceeded-breakdown-voltage prevention transistor and the latch circuit and the first power supply node.

18. A semiconductor device, comprising:
a level shifter,
wherein the level shifter includes:
a latch circuit including a pair of first-conductivity-type cross-coupled transistors each coupled to a first power supply node to which a high power supply voltage is input;
an input circuit including a pair of second-conductivity-type transistors each coupled to a second power supply node to which a reference voltage is input and having respective gates that receive complementary input signals to the level shifter; and
an exceeded-breakdown-voltage prevention circuit coupled between the latch circuit and the input circuit,
wherein the exceeded-breakdown-voltage prevention circuit includes:
a first-conductivity-type first exceeded-breakdown-voltage prevention transistor having a gate that receives a first intermediate voltage which is between the high power supply voltage and the reference voltage;
a second-conductivity-type second exceeded-breakdown-voltage prevention transistor having a gate that receives a second intermediate voltage which is between the high power supply voltage and the first intermediate voltage and coupled in series to the first exceeded-breakdown-voltage prevention transistor; and
a first-conductivity-type third exceeded-breakdown-voltage prevention transistor coupled in series to the first and second exceeded-breakdown-voltage prevention transistors between the first and second exceeded-breakdown-voltage prevention transistors and the latch circuit,
wherein the third exceeded-breakdown-voltage prevention transistor has a gate to which a fourth intermediate voltage is applied,
wherein the fourth intermediate voltage is between the high power supply voltage and the reference voltage and increases as the high power supply voltage increases, and
wherein the level shifter further includes a first-conductivity-type clamp transistor coupled between a coupling node between the third exceeded-breakdown-voltage prevention transistor and the latch circuit and the first power supply node.

* * * * *